United States Patent
Tao et al.

(10) Patent No.: US 9,478,269 B2
(45) Date of Patent: Oct. 25, 2016

(54) TRACKING MECHANISMS

(71) Applicant: TAIWAN SEMICONDUCTOR MANUFACTURING COMPANY, LTD., Hsinchu (TW)

(72) Inventors: Derek C. Tao, Fremont, CA (US); Annie-Li-Keow Lum, San Jose, CA (US); Yukit Tang, San Jose, CA (US); Kuoyuan (Peter) Hsu, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/541,687

(22) Filed: Nov. 14, 2014

(65) Prior Publication Data
US 2015/0071016 A1    Mar. 12, 2015

Related U.S. Application Data

(62) Division of application No. 13/253,749, filed on Oct. 5, 2011, now Pat. No. 8,913,440.

(51) Int. Cl.
*G11C 7/10* (2006.01)
*G11C 7/22* (2006.01)
*G11C 11/419* (2006.01)

(52) U.S. Cl.
CPC ............... *G11C 7/222* (2013.01); *G11C 7/10* (2013.01); *G11C 11/419* (2013.01); *G11C 7/1051* (2013.01)

(58) Field of Classification Search
CPC ............... G11C 11/419; G11C 2211/4061; G11C 27/02; G11C 7/222; G11C 7/10; G11C 13/004; G11C 2013/0054; G11C 117/222
USPC ............... 365/189.05, 191, 193, 194, 233.1, 365/233.11, 233.12, 230.01, 189.011, 233.5
See application file for complete search history.

(56) References Cited

U.S. PATENT DOCUMENTS

| | | | |
|---|---|---|---|
| 5,553,276 A | 9/1996 | Dean | |
| 5,724,294 A | 3/1998 | Khieu | |
| 5,828,622 A * | 10/1998 | McClure | G11C 5/063 365/149 |
| 6,026,042 A * | 2/2000 | Shirley | G11C 7/06 365/194 |
| 7,016,245 B2 | 3/2006 | Balasubramanian et al. | |
| 7,142,466 B1 | 11/2006 | Muthalif et al. | |
| 7,733,686 B2 * | 6/2010 | Clinton | G11C 11/413 365/154 |
| 8,879,303 B2 * | 11/2014 | Chandwani | G11C 7/12 365/154 |
| 2006/0250842 A1 * | 11/2006 | Adams | G11C 11/412 365/185.08 |
| 2007/0008771 A1 * | 1/2007 | Lee | G11C 7/14 365/154 |
| 2008/0298143 A1 * | 12/2008 | Chen | G11C 7/22 365/194 |
| 2011/0235444 A1 * | 9/2011 | Chuang | G11C 11/413 365/189.16 |
| 2011/0249524 A1 * | 10/2011 | Wang | G11C 7/08 365/205 |
| 2012/0307574 A1 * | 12/2012 | Cheng | G11C 11/419 365/189.14 |
| 2012/0314477 A1 * | 12/2012 | Siau | G11C 8/08 365/148 |

* cited by examiner

*Primary Examiner* — Son Dinh
*Assistant Examiner* — Uyen B Tran
(74) *Attorney, Agent, or Firm* — Hauptman Ham, LLP

(57) ABSTRACT

A memory macro includes a plurality of segments corresponding to a plurality of tracking circuits. Each segment of the plurality of segments thereby corresponds to one tracking circuit of the plurality of tracking circuits. In response to a read operation of a memory cell of a segment, a tracking circuit corresponding to the segment is configured to generate an edge of a tracking signal based on which a first edge of a cell signal associated with the memory cell is generated.

20 Claims, 22 Drawing Sheets

|  | EXCLK | TRRSET | ICLK | XCLK | YCLK |
|---|---|---|---|---|---|
| 905 | ^ | 1 | v | ^ | ^ |
| 910 | 1 | 1 | 0 | 1 | 1 |
| 915 | v | 1 | 0 | 1 | 1 |
| 920 | 0 | v | ^ | v | v |

FIG. 9A

|      | EXCLK | TRRSET | ICLK | XCLK | YCLK |
|------|-------|--------|------|------|------|
| 1005 | ^     | 1      | v    | ^    | ^    |
| 1010 | 1     | 1      | 0    | 1    | 1    |
| 1015 | 1     | v      | ^    | v    | 1    |
| 1020 | v     | 0      | 1    | 0    | v    |

TRACKING MECHANISMS

PRIORITY CLAIM

The present application is a divisional of U.S. application Ser. No. 13/253,749, filed Oct. 5, 2011, now U.S. Pat. No. 8,913,440, issued Dec. 16, 2014, which is incorporated herein by reference in its entirety.

FIELD

The present disclosure is related to tracking mechanisms.

BACKGROUND

Tracking circuits in a memory macro have tracking cells used to generate tracking or reference signals based on which signals for reading memory cells are generated. In an approach, one tracking circuit is used for memory cells in more than one segment of a memory macro. However, various circuitries such as the global clock, the X-address decoder, the global bit line, etc. of various segments may not be part of the tracking process.

In many approaches, tracking paths of the tracking circuits are in one direction, such as the X-decoder direction. Other directions are not tracked.

BRIEF DESCRIPTION OF THE DRAWINGS

The details of one or more embodiments of the disclosure are set forth in the accompanying drawings and the description below. Other features and advantages will be apparent from the description, drawings, and claims.

FIG. 9A is a table and FIG. 9B is a graph of waveforms used to illustrate the relationship of various signals when the tracking reset signal falls after the external clock falls.

FIG. 10A is a table and FIG. 10B is a graph of waveforms used to illustrate the relationship of various signals when the tracking reset signal falls before the external clock falls.

Like reference symbols in the various drawings indicate like elements.

DETAILED DESCRIPTION

Figure 1A:
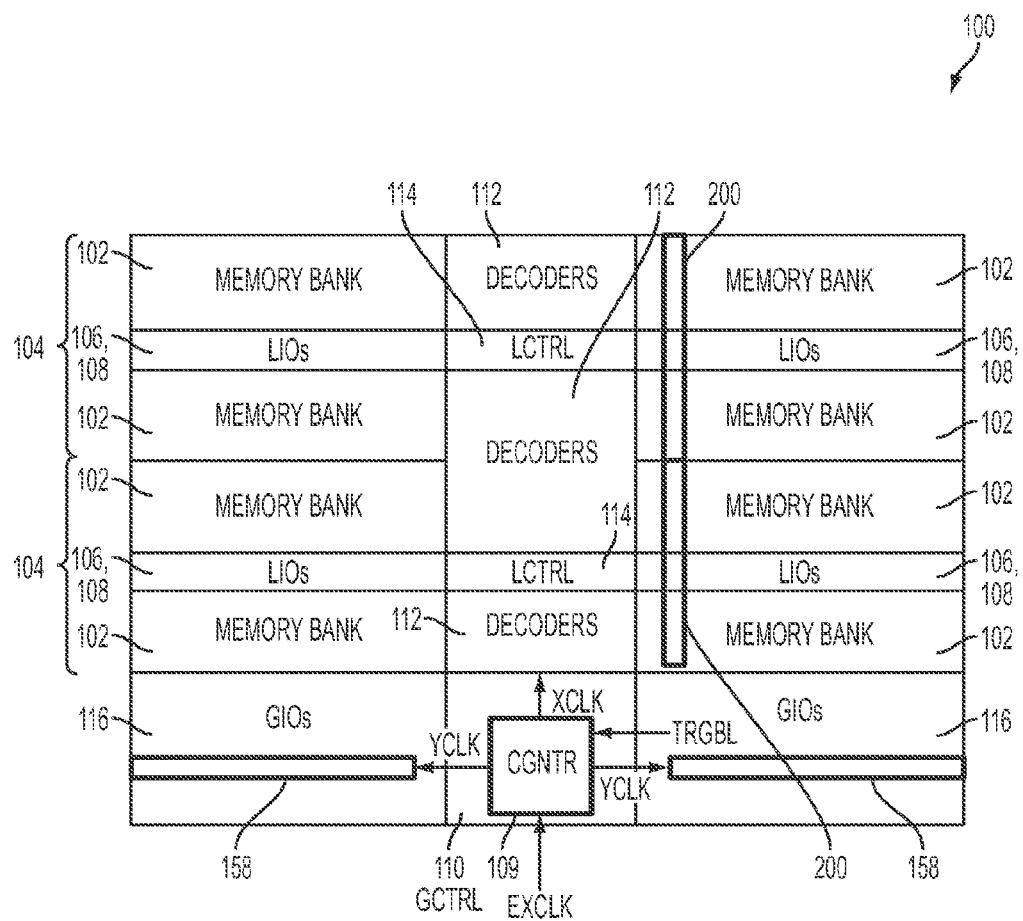
FIG. 1A is a block diagram of a memory macro, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. The active tracking bit lines and tracking cells in the X-decoder direction are in the same segment as the memory cell to be read (the accessed memory cell). As a result, the timings generated by the tracking cells are closer to the timings of the accessed memory cell. In other words, the variations between the tracking cells and the accessed cells are reduced. The resistance and capacitance of the global clock in the X-address decoders, the global bit lines, and the read word lines are part of the tracking process. As a result, the memory macro can operate with higher speeds over a large voltage range.

Exemplary Memory Macro

FIG. 1A is a block diagram of a static random access memory (SRAM) macro 100, in accordance with some embodiments. In this document, "rise" refers to transitioning from a low logic value to a high logic value and "fall" refers to transitioning from a high logic value to a low logic value.

Memory macro 100 is symmetrical. That is, circuit elements on the left side are similar to circuit elements on the right side. Memory macro 100 includes a plurality of memory segments 104. Two memory segments 104 are shown for illustration, but a different number of memory segments 104 is within the scope of various embodiments. Each segment 104 includes four memory banks 102. On each left and right side of memory macro 100, two memory banks 102 share a row of a plurality of local input-output circuits (LIOs) 106 and 108. Each segment 104 includes a tracking circuit 200 in the X-decoder direction. Different configurations of a memory segment are within the scope of various embodiments. Each memory bank 102 includes a plurality of memory cells 122 and a plurality of tracking memory cells 124 in a tracking circuit 200, which is described with reference to FIG. 2.

Address decoders 112 provide the X- or row-address of memory cells 122 to be accessed for a read or a write operation. For example, address decoders 112 determine the corresponding read word line of the accessed memory cells to be turned on based on the address of the accessed memory cells. In some embodiments, the address of the accessed memory cells is latched into global control circuit (GCTRL) 110 based on a rising edge of clock EXCLK.

Local control circuits (LCTRL) 114 control LIOs 106 and 108, including, for example, turning on and off the read word lines and write word lines of the memory cell. For example, in some embodiments, based on a rising edge of a clock XCLK (shown in FIG. 8) and the address of a memory cell to be read, LCTRL 114 generates a rising edge of a corresponding read word line of the memory cell to be read. Similarly, based on the falling edge of clock XCLK, LCTRL 114 generates a falling edge of the same read word line.

Global input/output circuits (GIOs) 116 serve to transfer data between the memory cells and other circuits outside of memory macro 100. GIO circuits 116 include two tracking circuits 158 in the Y-decoder direction, which are described with reference to FIG. 16.

Global control circuit (GCTRL) 110 provides the address pre-decode, clock, and other signals for memory macro 100. GCTRL 110 includes a Y-decoder (not shown) that provides the Y- or column address of a memory cell. GCTRL 110 controls reading and writing operations or the data transfer between memory cells 122 and circuits outside of memory macro 100.

Figure 3:
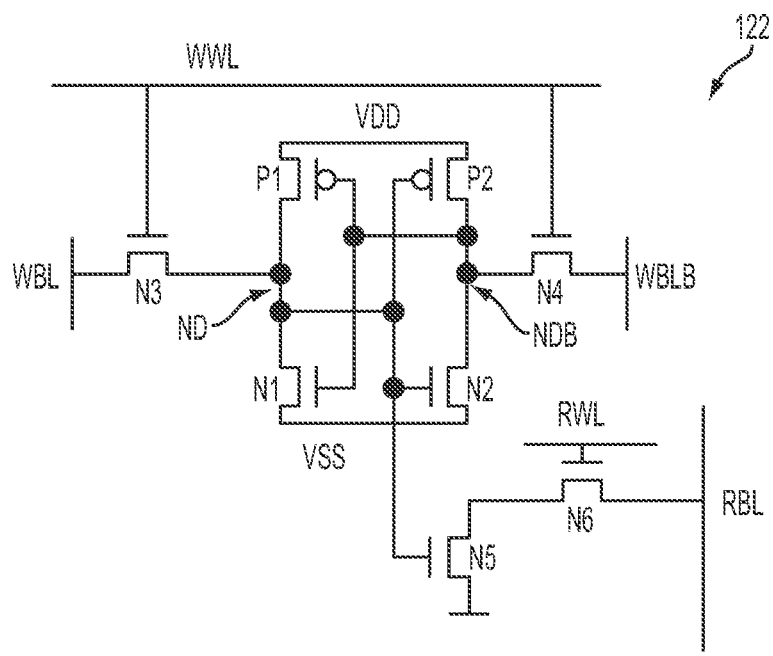
FIG. 3 is a circuit diagram of a memory cell, in accordance with some embodiments.
Figure 4:
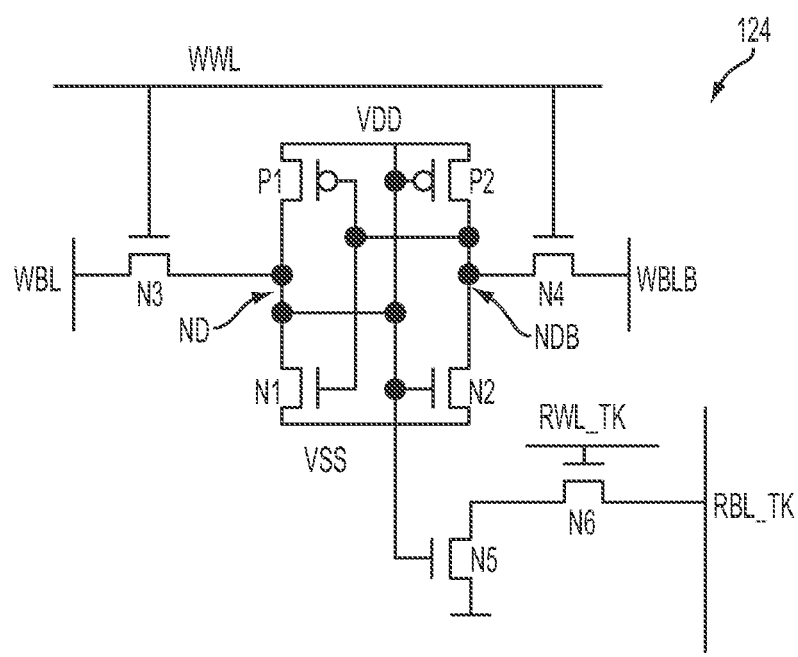
FIG. 4 is a circuit diagram of a tracking memory cell, in accordance with some embodiments.
Figure 8:
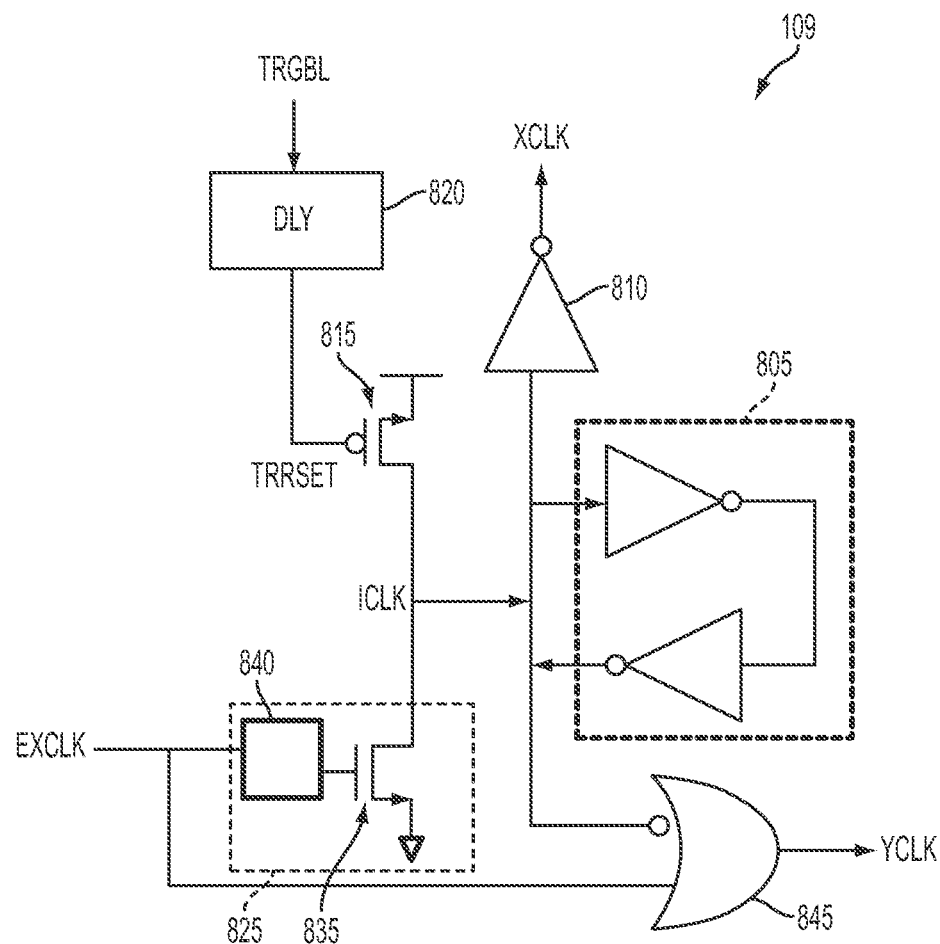
FIG. 8 is a block diagram of a clock generator, in accordance with some embodiments.

Clock generator (CGNTR) 109 receives an external clock EXCLK and tracking global bit line TRGBL as inputs and generates an intermediate clock ICLK (shown in FIG. 8). Based on intermediate clock ICLK, clock generator 109 generates a clock XCLK running in the direction of X decoders 112 and two clocks YCLK running in the Y decoders or in the directions of GIOs 116. Clocks XCLK and YCLK are commonly called the X-clock and Y-clock, respectively. Clock XCLK controls the read word line pulse width of memory cells 122 and of tracking cells 124. Details of a memory cell 122 and a tracking cell 124 are shown in FIGS. 3 and 4, respectively. Clock YCLK controls the data in GIOs 116. For example, in some embodiments, the rising edge of clock YCLK turns off the tri-state feedback inverters and turns on the multiplexers in GIOs 116 so that the data in memory cells 122 that have been transferred to the global bit lines of memory macro 100 are transferred to the outputs of memory macro 100. In contrast, the falling edge of clock YCLK turns off the multiplexers and turns on the tri-state feedback inverters. Tracking global bit line TRGBL is generated based on clock XCLK. The details of clock generator 109 are explained with reference to FIG. 8.

In some embodiment, a rising edge of external clock EXCLK causes clock YCLK to rise from a low logic value to a high logic value. An intermediate clock ICLK (shown in FIG. 8) is created based on external clock EXCLK. The high duration of clock YCLK is achieved by a logical OR operation of the high duration of external clock EXCLK and an inverse of intermediate clock ICLK. As a result, the high duration of clock YCLK is the larger of the high duration of external clock EXCLK and the low duration of intermediate ICLK. Because the duration of clock YCLK is enlarged, a read margin is increased.

The transition of global tracking bit line TRGBL causes a transition in a reset signal, which is called a reset transition. In some embodiments, the reset is a low logic reset. That is, the reset transition is from a high logic value to a low logic value. A high logic reset is within the scope of various embodiments.

Exemplary Memory Segment

Figure 1B:
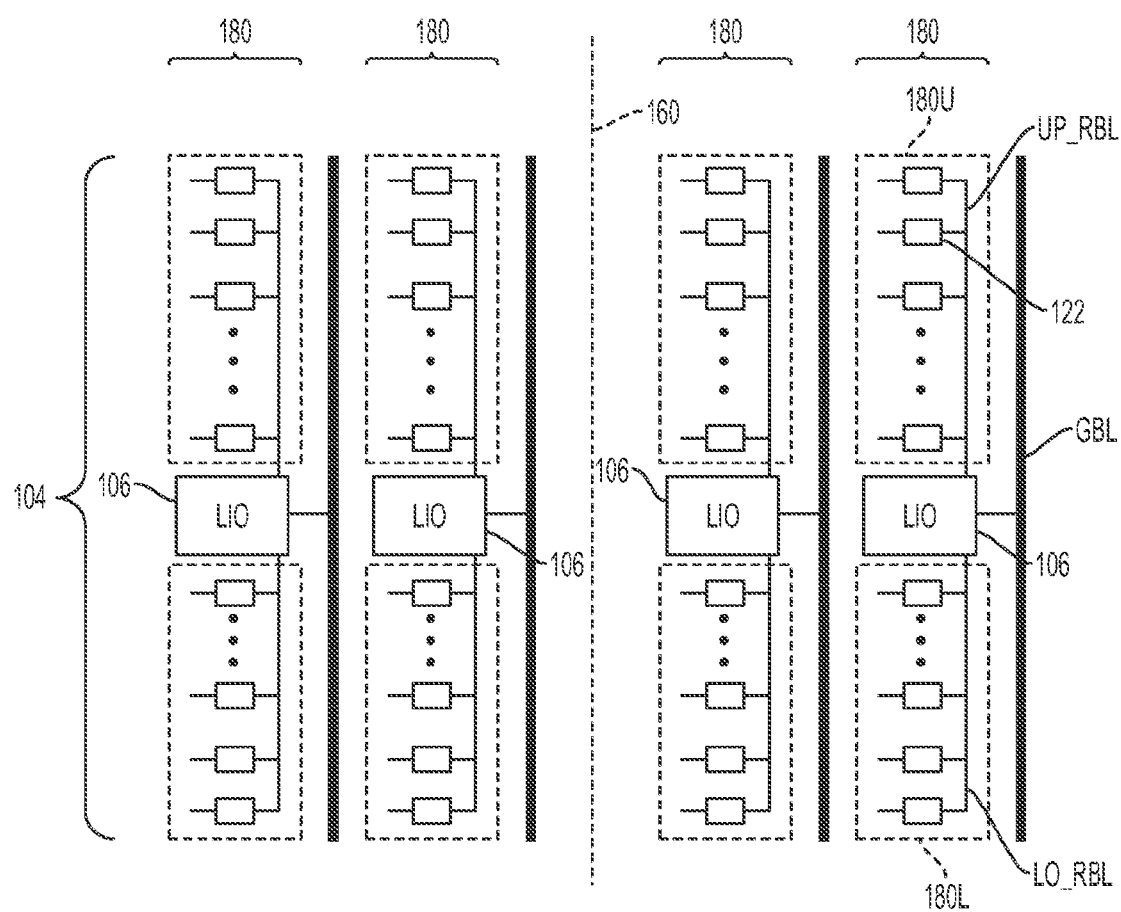
FIG. 1B is a diagram of a memory segment, in accordance with some embodiments.

FIG. 1B is a diagram of a segment 104, in accordance with some embodiments. A segment 104 includes a plurality of columns on the left and a plurality of columns on the right. For illustration, FIG. 1B shows two columns 180 on the left and two columns 180 on the right of dotted line 160 used as a center reference. For simplicity, elements of one column 180 on the right of dotted line 160 are labeled.

Each column 180 includes an LIO 106 coupling a column 180U and a column 180L. An upper column 180U includes a read bit line UP_RBL coupling a plurality of first memory cells 122. For simplicity, only one memory cell 122 is labeled. Similarly, a lower column 180L includes a read bit line LO_RBL coupling a plurality of second memory cells 122. In some embodiments, the number of first memory cells 122 in an upper column is the same as the number of second memory cells 122 in a lower column. In some embodiments, in a read operation, one memory cell 122 in an upper column or in a lower column is read.

Each column 180 also includes a global bit line GBL coupled to an LIO 106. In some embodiments, a global bit line GBL couples all LIOs 106 that are on the same column direction but belong to different segments 104. Further, memory macro 100 includes a plurality of global bit lines GBL. The number of global bit lines GBL is the same as the number of columns of memory cells in memory macro 100. In some embodiments, the number of global bit lines GBL is different from the number of columns of memory cells in memory macro 100.

Figure 2:
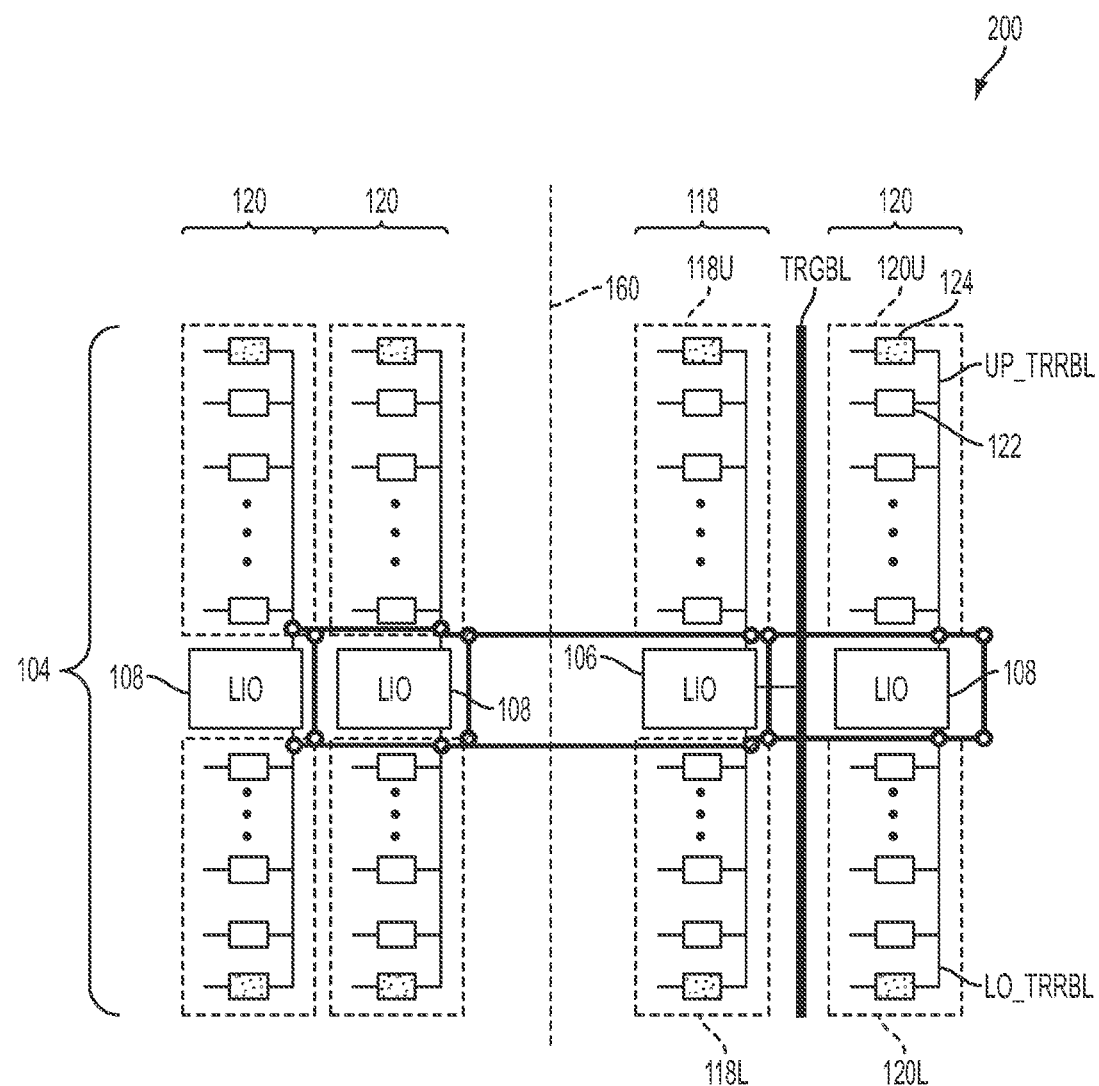
FIG. 2 is a diagram of a tracking circuit in the X-decoder direction, in accordance with some embodiments.

In some embodiments, each segment 104 also includes a tracking circuit 200 detailed in FIG. 2.

Exemplary Tracking Circuit in the X Direction

Figure 16:
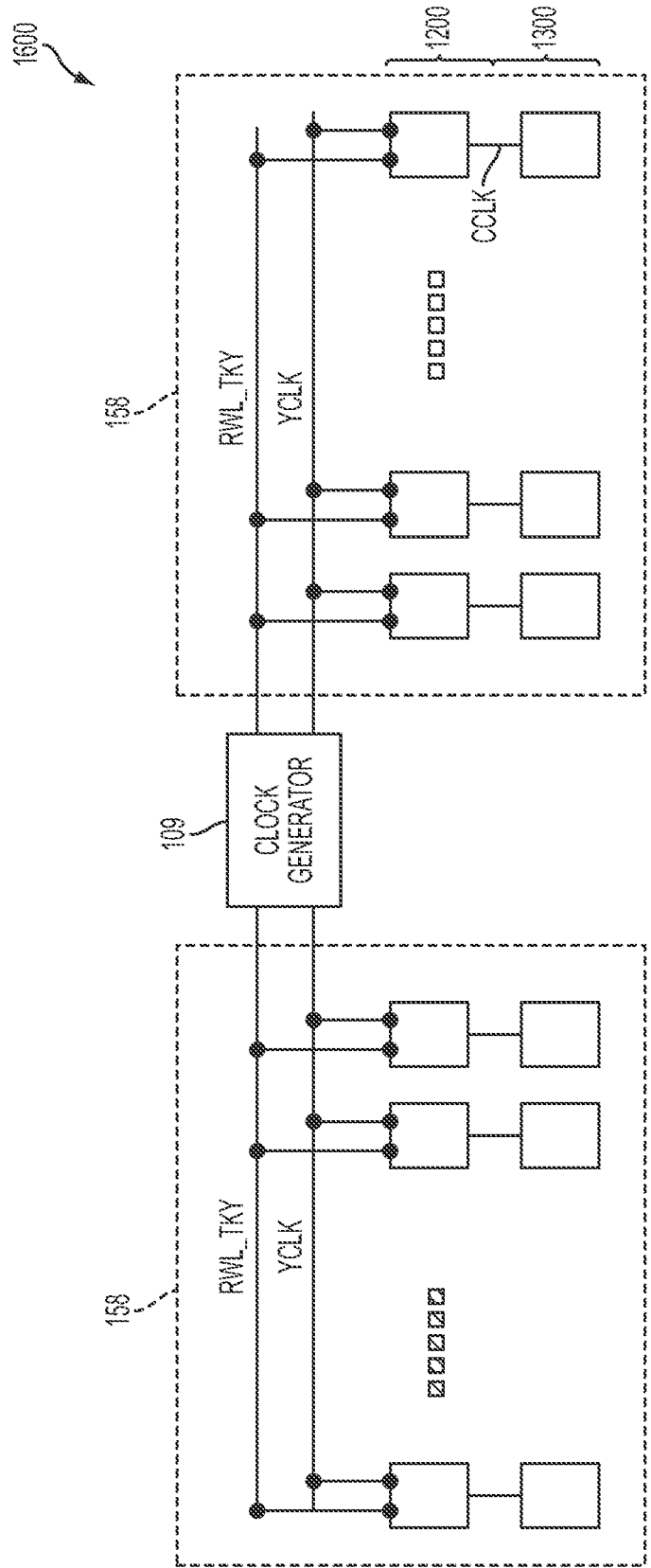
FIG. 16 is a diagram of a tracking circuit in the Y direction, in accordance with some embodiments.

FIG. 2 is a diagram of various elements of a segment 104 illustrating a tracking circuit 200, in accordance with some embodiments. Tracking circuit 200 is called a tracking circuit in the X-decoder or X-direction because the tracking path of circuit 200 travels in the direction of X-decoders 112. In contrast, tracking circuit 1600 in FIG. 16 is called a tracking circuit in the Y-decoder or Y-direction.

For simplicity, one memory cell 122 of various memory cells 122 and one tracking memory cell 124 of eight tracking memory cells 124 are labeled. One column 120U of three columns 120U and one column 120L of three columns 120L are labeled. One upper tracking read bit line of four tracking read bit lines UP_TRRBL, and one lower tracking read bit line of four tracking read bit lines LO_TRRBL are labeled.

Tracking circuit 200 includes one column 118 and three columns 120. A column 118 and a column 120 are each a variation of a column 180 of regular memory cells 122. Each column 120 includes one LIO 108 with a column 120U above the LIO 108 and a column 120L below the LIO 108. Each column 120U includes a plurality of memory cells 122 and one tracking memory cell 124 coupled to an upper tracking read bit line UP_TRRBL. Each column 120L includes a plurality of memory cells 122 and one tracking memory cell 124 coupled to a lower tracking read bit line LO_TRRBL. A column 118 includes one LIO 106 with a column 118U above the LIO 106 and a column 118L below the LIO 106. Column 118U includes a plurality of memory cells 122 and one tracking memory cell 124 coupled with an upper tracking read bit line UP_TRRBL. Column 118L includes a plurality of memory cells 122 and one tracking memory cell 124 coupled with a lower tracking read bit line LO_TRRBL.

In some embodiments, upper tracking read bit lines UP_TRRBL and lower tracking read bit lines LO_TRRBL of all three columns 120 and of column 118 are coupled together. Upper tracking read bit lines UP_TRRBL, lower tracking read bit lines LO_TRRBL, and a tracking global bit line TRGBL are coupled to tracking LIO 106. Column 118 and one column 120 are on one right side of memory macro 100, and the other two columns 120 are on one left side of memory macro 100. In some embodiments, column 118 and columns 120 are selected adjacent to decoders 112 and local control circuitry LCTRL 114 in FIG. 1 to increase the speed and simplify the implementation of memory 100. Different locations of column 118 and/or columns 120 are within the scope of various embodiments. The relative locations of a column 118 and 120 are within the scope of various embodiments. For example, two columns 120 and a pair of a column 118 and a column 120 may be next to one another as shown in FIG. 2, but they may be separated by one or a plurality of columns of regular memory cells 122.

Columns 120 are used to create the load for column 118. Three columns 120 are used for illustrations, a different number of columns 120 used as a load for column 118 is within the scope of various embodiments.

In some embodiments, for each segment 104, there is a corresponding tracking circuit 200. For example, memory macro 100 in FIG. 1 shown having two segments 104 has two tracking circuits 200. But if memory macro 100 has more than two segments 104, there would be the same number of tracking circuits 200 corresponding to the number of segments. A column 120 can be on the left side or on the right side of memory macro 100. In some embodiment, when a memory cell 122 in one of the corresponding memory segment 104 is accessed, the corresponding tracking circuit 200 is turned on to generate tracking signals based on which read signals for the accessed memory cell 122 are generated. A tracking circuit 200 in a memory segment 104 closer to clock generator 109 has a shorter tracking cycle while a tracking circuit 200 in a memory segment 104 further away from clock generator 109 has a longer tracking cycle.

In some embodiments, a tracking global bit line TRGBL is coupled to a different number of LIOs 106 as a global bit line GBL dies. In some embodiments, a tracking global bit line TRGBL couples all LIOs 106 of tracking circuits 200 in a same column direction. In other words, a tracking global bit line TRGBL is shared by all tracking circuits 200 of memory macro 100. As a result, a tracking global bit line TRGBL is coupled to a same number of LIOs 106 as a global bit line GBL does. Explained differently, a tracking global bit line TRBGL is about the same length as a global bit line GBL. Effectively, tracking circuit 200 when in operation simulates closer to the condition of a read operation in which a global bit line GBL is used to carry the read data of the accessed memory cell. Stated in another way, the resistance and capacitance of a global bit line GBL are part of a tracking process. As a result, various embodiments are advantageous over other approaches in which a tracking global bit line is constrained to a specific segment and is therefore of a shorter length than a global bit line GBL in the read operation.

Exemplary Memory Cell

FIG. 3 is a circuit diagram of a memory cell 122, in accordance with some embodiments. Memory cell 122 includes two PMOS transistors P1 and P2, and six NMOS transistors N1, N2, N3, N4, N5, and N6.

The gates of NMOS transistor N3 and N4 are coupled to a write word line WWL. A write word line WWL is coupled to the gates of transistors N3 and N4 of a plurality of memory cells 122 to a form a row of memory cells.

The gate of transistor N6 is coupled to a read word line RWL. A read word line RWL is coupled to the gates of transistors N6 of the plurality of memory cells 122 that are coupled to a corresponding write word line WWL.

The drain of transistor N6 is coupled to a read bit line RBL. Read bit line RBL is coupled to the drains of a plurality of transistors N6 of a plurality of memory cells 122 to form a regular column 180U, 180L, a column 118U, 118L, 120U, or 120L. If memory cell 122 is in a column 180U, read bit line RBL is called UP_RBL. But if memory cell 122 is in a column 180L, read bit line RBL is called LO_RBL. Similarly, if memory cell 122 is in a column 118U or a column 120U, read bit line RBL is called upper read bit line UP_TRRBL. But if memory cell 122 is in a column 118L or a column 120L, read bit line RBL is called lower read bit line LO_TRRBL.

The drains of transistors N3 and N4 are coupled to a pair of write bit lines WBL and WBLB, respectively. Write bit lines WBL and WBLB are coupled to the drains of transistors N3 and N4 of the plurality of memory cells 122, respectively, that are coupled to the corresponding read bit line RBL.

In a write operation for a memory cell 122, write word line WWL is activated. The logic values to be written to memory cell 122 are placed at write bit lines WBL and WBLB, which are then transferred or stored at nodes ND and NDB at the sources of transistor N3 and N4, respectively.

In a read operation, read word line RWL is activated to turn on transistor N6. Detecting the voltage value at read bit line RBL reveals the data stored in nodes NDB and ND. In some embodiments, the read data reflected on read bit line RBL is then transferred through an LIO 106 to a global bit line GBL, to GIO circuit 116, and circuits outside of memory macro 100.

Exemplary Tracking Cell in the X Direction

FIG. 4 is circuit diagram of a tracking memory cell 124 in the X-decoder direction, in accordance with some embodiments.

Tracking memory cell 124 includes circuit components similar to those of memory cell 122. Tracking read word line RWL_TK and tracking read bit line RBL_TK correspond to read word line RWL and read bit line RBL of memory cell 122, respectively. The gate of transistors P2, N2, and N5 in tracking cell 124 are configured to receive operational voltage VDD. As a result, PMOS transistor P2 is always off while NMOS transistors N2 and N5 are always on when voltage VDD is provided. Similar to memory cell 122, if track memory cell 124 is in a column 118U or a column 120U, read bit line RBL_TK is called upper read bit line UP_TRRBL. But if tracking memory cell 124 is used in a column 118L or a column 120L, read bit line RBL_TK is called lower read bit line LO_TRRBL.

Exemplary LIOs

Figure 5:
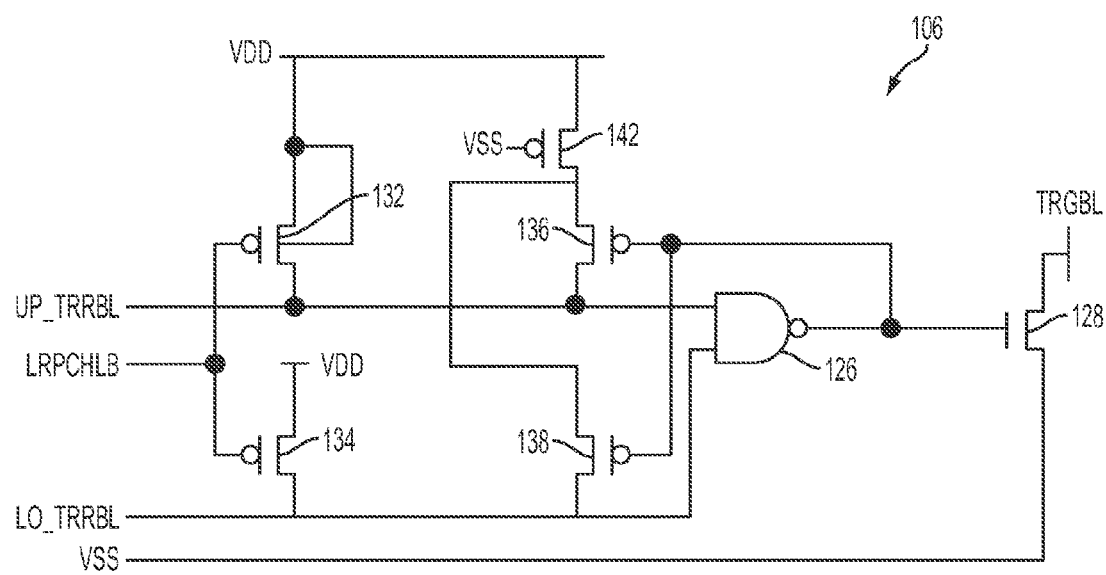
FIG. 5 is a circuit diagram of a local IO circuit, in accordance with some embodiments.

FIG. 5 is a circuit diagram of an LIO 106, in accordance with some embodiments. An LIO 106 is used in both a regular column 180 in FIG. 1B and a tracking column 118 in FIG. 2. In a regular column 180, upper tracking read bit line UP_TRRBL and lower tracking read bit line LO_TRRBL are called upper read bit line UP_RBL and lower read bit line LO_RBL, respectively, and tracking global bit line TRGBL is called global bit line GBL. For illustration, LIO 106 in FIG. 5 is explained in the context of a tracking column 118. Operation of LIO 106 in the context of a regular column 180 is similar and should be recognizable by persons of ordinary skill in the art.

Each input of NAND gate 126 is coupled to an upper tracking read bit line UP_TRRBL and a lower tracking read bit line LO_TRRBL. In some embodiments as illustrated in FIG. 2, upper read bit line UP_TRRBL and lower read bit line LO_TRRBL are coupled together. The output of NAND gate 126 controls the gate of transistor 128, or, effectively, controls tracking global bit line TRGBL at the drain of transistor 128. Transistors 132, 134, 136, and 138 provide appropriate voltage values to the inputs of NAND gates 126, based on control signal LRPCHLB, operational voltage VDD and reference voltage VSS.

Figure 6:
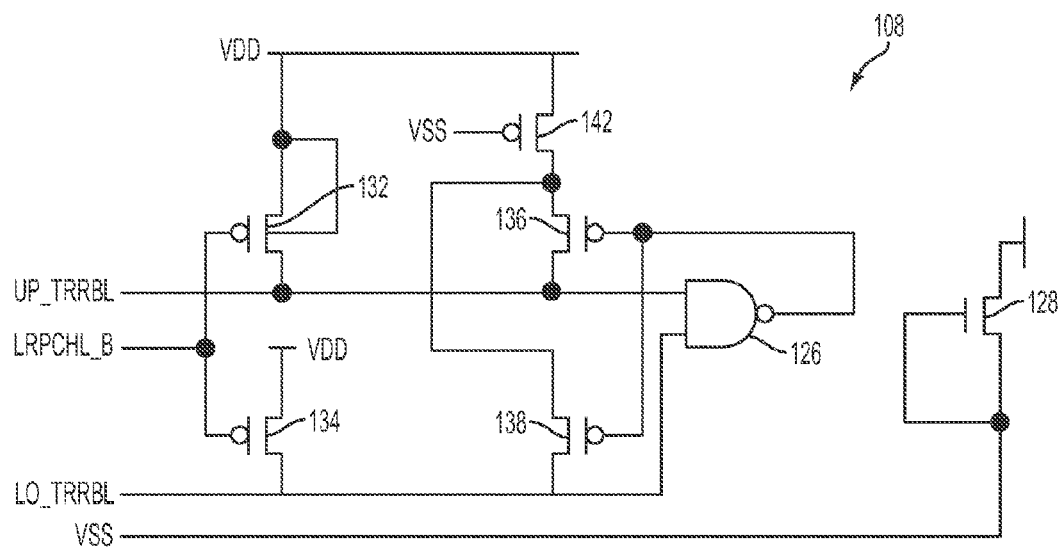
FIG. 6 is a circuit diagram of a tracking IO circuit, in accordance with some embodiments.

FIG. 6 is a circuit diagram of an LIO 108, in accordance with some embodiments. An LIO 108 includes components similar to those of an LIO 106. The output of NAND gate 126 in LIO 108, however, is not coupled to the gate of transistor 128. In contrast, the gate of transistor 128 is coupled to the source of transistor 128 or voltage VSS. As a result, transistor 128 is always off and acts as an open circuit.

Exemplary Tracking Path in the X Direction

Figure 7A:
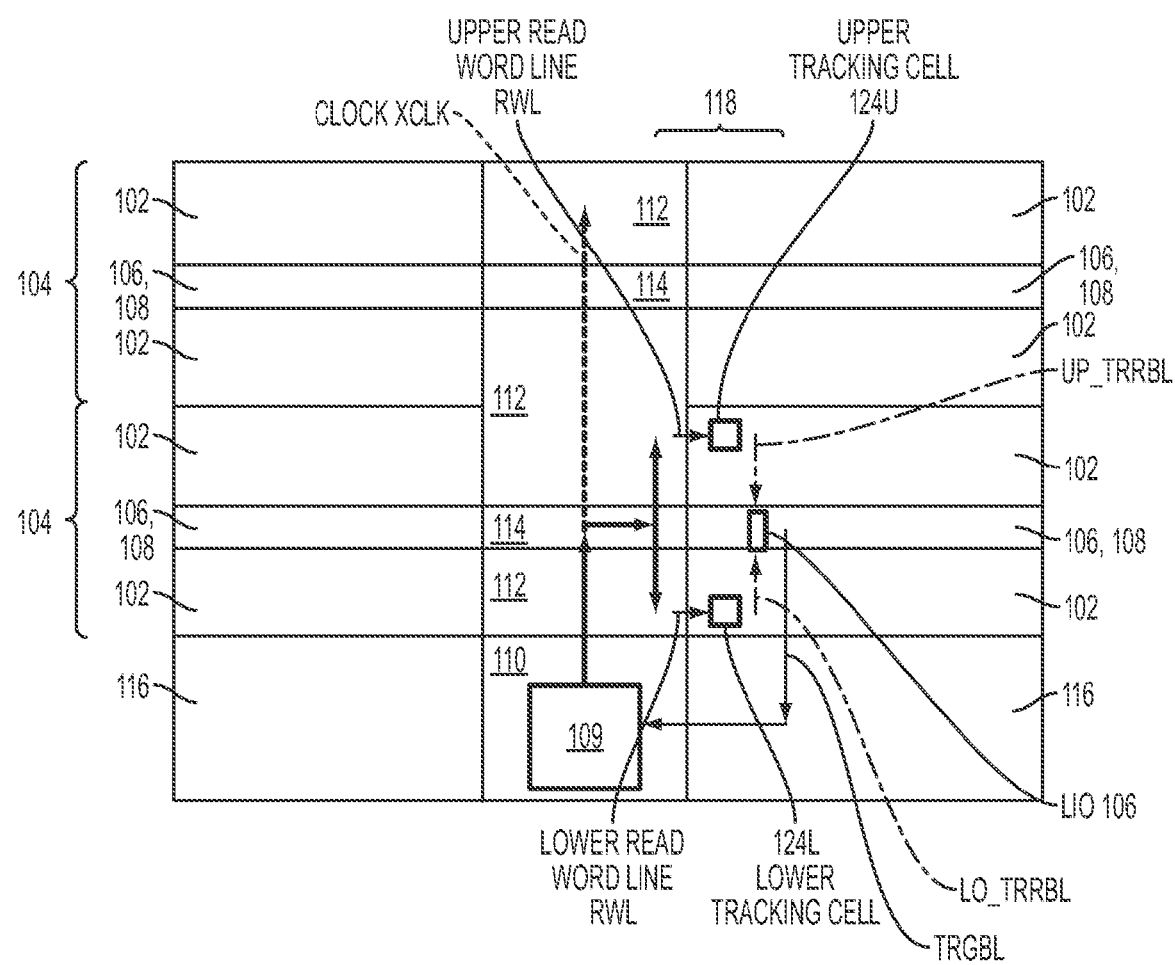
FIG. 7A is a diagram of a memory macro used to illustrate a tracking path in the X-decoder direction, in accordance with some embodiments.

FIG. 7A is a block diagram of memory macro 100 used to illustrate a tracking path in the X-decoder direction, in accordance with some embodiments. FIG. 7 shows an example of a tracking path of a circuit 200 for a memory segment 104. The tracking path of another tracking circuit 200 for another segment 104 of memory macro 100 is similar and should be recognizable by persons of ordinary skill in the art in view of this document. In some embodiments, reading a memory cell 122 in the corresponding segment 104 triggers the corresponding tracking circuit 200 and the tracking path as illustratively shown in FIG. 7.

In some embodiments, tracking global bit line TRGBL transitions from a high logic value to a low logic value. The transition of tracking global bit line TRGBL is caused by an operation of a tracking circuit 200 that includes one column 118 and three columns 120 illustratively shown in FIG. 2. For simplicity, some elements of column 118 in FIG. 2 are shown FIG. 7, but three columns 120 are not shown. Effectively, the transition of tracking global bit line TRGBL is caused by the operations of an upper tracking cell 124 and a lower tracking cell 124 illustratively shown in FIG. 4. As a result, tracking read bit line RBL_TK of the upper tracking cell 124 and of the lower tracking cell 124 correspond to upper read tracking bit line UP_TRRBL and lower read tracking bit line LO_TRRBL of column 118U and column 118L, respectively. The transition of tracking global bit line TRGBL is also caused by the operations of the LIO 106 coupled to upper read tracking bit line UP_TRRBL and lower read tracking bit line LO_TRRBL. The detail of LIO 106 is shown in FIG. 5. In some embodiments, upper tracking read bit line UP_TRRBL, lower tracking read lit line LO_TRRBL, and global tracking bit line are initially pre-charged to a high logical value.

In some embodiments, a rising edge of clock EXCLK causes clock XCLK and clock YCLK to rise. Once the rising edge of clock XCLK is generated, clock XCLK is then transmitted from clock generator 109 through one or various decoders 112 and local control circuitry LCTRL 114 to a corresponding segment 104 that includes a memory cell 122 to be read. Based on the rising edge of clock XCLK, an LCTRL 114 corresponding to the memory cell 122 to be read causes a corresponding read word line RWL of the memory cell 122 to be read to rise. The data at node ND or the gate of transistor N5 of the memory cell 122 to be read is reflected on the corresponding read bit line RBL. Through a corresponding local LIO 106 coupling the read bit line RBL and global bit line GBL, the data to be read is transferred from read bit line RBL to the corresponding global bit line GBL, which is then transferred to global IO circuit 1300 (illustrated in FIG. 13), and to other circuitries outside of memory macro 100.

The rising edge of clock XCLK is also transmitted to a corresponding tracking circuit 200 of a corresponding segment 104 that includes the memory cell 122 to be read. Clock XCLK is then used to activate the upper tracking read word line RWL_TK (shown in FIG. 4) and the lower tracking read word line RWL_TK of the respective upper tracking cell 124 and the lower tracking cell 124 of tracking circuit 200. For example, in some embodiments, a high logic value during the high duration of clock XCLK causes transistors N6 of upper tracking cell 124 and of lower tracking cell 124 to turn on. Upper read tracking bit line UP_TRRBL and lower read tracking bit line LO_TRRBL are pulled to ground or a low logic value at the source of transistors N5 of upper tracking cell 124 and of lower tracking cell 124. NAND gate 126 of LIO 106 illustrated in FIG. 5 receives a low logic value of upper tracking read bit line UP_TRRBL and of lower tracking read bit line LO_TRRBL at both inputs. As a result, output of NAND gate 126 at the gate of transistor 128 has a high logic value, which turns on NMOS transistor 128. Because transistor 128 is turned on, tracking global bit line TRGBL is pulled to reference voltage VSS or a low logic value at the source of transistor 128. Effectively, global tracking bit line TRGBL transitions from a high logic value to a low logic value. In some embodiments, global tracking bit line TRGBL is fed to clock generator 109, and causes a tracking reset signal TRRSET (shown in FIG. 8) to also transition from a high to a low logic value. In this document, a reference to the high to low transition of global tracking bit line TRGBL also refers to the high to low transition of tracking reset signal TRRSET.

In some embodiments, the falling edge of tracking global bit line TRGBL causes clock ICLK to rise and clocks XCLK and YCLK to fall. The falling edge of clock XCLK then travels through one or a plurality of decoders 112 and local control circuitry LCTRL 114 to the segment 104 having the memory cell 122 to be read. A corresponding LCTRL 114, based on the falling edge of clock XCLK, causes the falling edge of the corresponding read word line RWL of the memory cell to be read. The LCTRL 114 also causes the rising edge of the corresponding RBL.

Exemplary Waveforms for Tracking in the X Direction

Figure 7B:
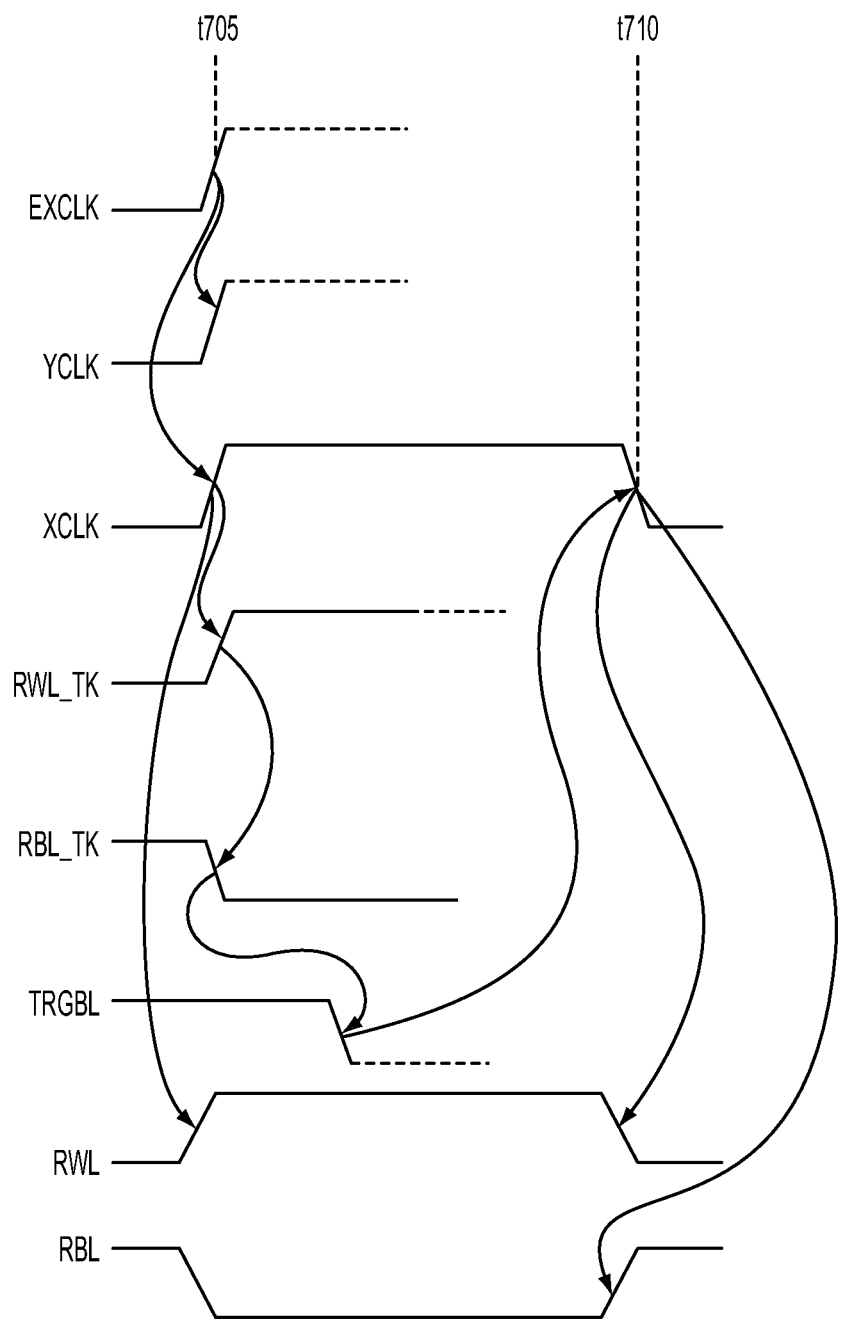
FIG. 7B is a graph of waveforms illustrating the relationships of various signals, in accordance with some embodiments.

FIG. 7B is a graph of waveforms illustrating the relationships of various signals, in accordance with some embodiments.

At time t705, a rising edge of clock EXCLK causes clocks XLCK and YCLK to rise.

The rising edge of clock XCLK causes the read word lines RWL_TK of tracking cells 124 of tracking circuit 200 and a read word line RWL of the memory cell 122 to be read to rise.

The rising edge of tracking read word lines RWL_TK cause tracking read bit lines RBL_TK of tracking cells 124 of tracking circuit 200 to fall.

The falling edges of tracking read bit lines RBL_TK cause tracking global bit line TRGBL to fall.

At time t710, the falling edge of tracking global bit line TRGBL causes clock XCLK to fall.

The falling edge of clock XCLK causes read word line RWL of the memory cell 122 to be read to fall, and read bit line RBL of the memory cell 122 to be read to rise.

Exemplary Tracking Method in the X Direction

Figure 7C:
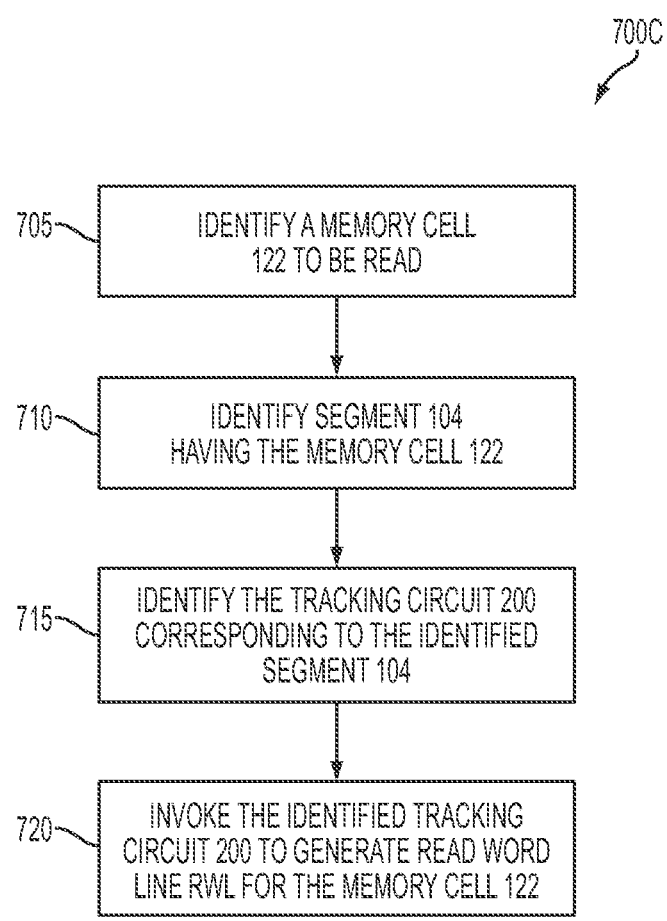
FIG. 7C is a flowchart of a method illustrating tracking in the X direction, in accordance with some embodiments.

FIG. 7C is a flow chart of a method 700C illustrating tracking in the X direction, in accordance with some embodiments.

In step 705, a memory cell 122 to be read is identified. For illustration, the address of the memory cell 122 is provided.

In step 710, a segment 104 having the identified memory cell 122 to be read is identified, based on the address of the identified memory cell 122.

In step 715, the tracking circuit 200 corresponding to the identified segment 104 is identified.

In step 720, the identified tracking circuit 200 is invoked based on which read word line RWL of the accessed memory cell 122 is generated as explained above with reference to FIGS. 7A and 7B.

Exemplary Clock Generator

FIG. 8 is a diagram of a clock generator 109, in accordance with some embodiments.

Delay circuit 820 (DLY 820) generates tracking reset signal TRRSET based on tracking global bit line TRGBL. For example, in some embodiments, when tracking global bit line TRGBL transitions from a high to a low logic value, circuit DLY 820 also causes tracking reset signal TRRSET to transition from a high to a low logic value. Circuit DLY 820 additionally generates a time delay to control the timing of tracking reset signal TRRSET. Effectively, circuit DLY 820 controls the time to reset clock XCLK and clock YCLK as explained below.

Circuit 825 and transistor 815 generate clock ICLK. For example, initially when clock ICLK is logically high, NMOS transistor 835 is turned on to pull clock ICLK to a low logical value at the source of transistor 835. A falling edge of clock ICLK is therefore formed. When tracking reset signal TRRSET falls, transistor 815 is turned on to pull clock ICLK to a high logic value at the source of transistor 815. As a result, a rising edge of clock ICLK is formed. Pulse width generator 840 generates a pulse PULSE (not shown) to turn on and off transistor 835. For example, when clock EXCLK rises, pulse width generator 840 generates pulse PULSE in which the high logic value of pulse PULSE causes transistor 835 to turn on while the low logic value of pulse PULSE causes transistor 835 to turn off. In some embodiments, pulse PULSE is designed to be a positive pulse and falls before tracking reset signal TRRSET falls. As a result, NMOS transistor 835 is turned off before PMOS transistor 815 is turned on.

Latch circuit 805 stores the logic state of clock ICLK as would be recognizable by persons of ordinary skill in the art.

Inverter 810 inverts clock ICLK to form clock XLCK. In other words, clock XCLK is the inverse logic of clock ICLK.

NOR gate 845 generates clock YCLK based on clock EXCLK and the inverse of clock ICLK. For illustration, the inverse of clock ICLK is called clock ICLKI (not labeled). In some embodiments, the falling edge of clock YCLK is the later of the falling edge of clock EXCLK and the falling edge of clock ICLKI. The falling edge of clock ICLKI or the rising edge of clock ICLK is caused by the falling edge of signal TRRSET that turns on transistor 815.

Exemplary Operations of Clock Generator

Figure 9B:
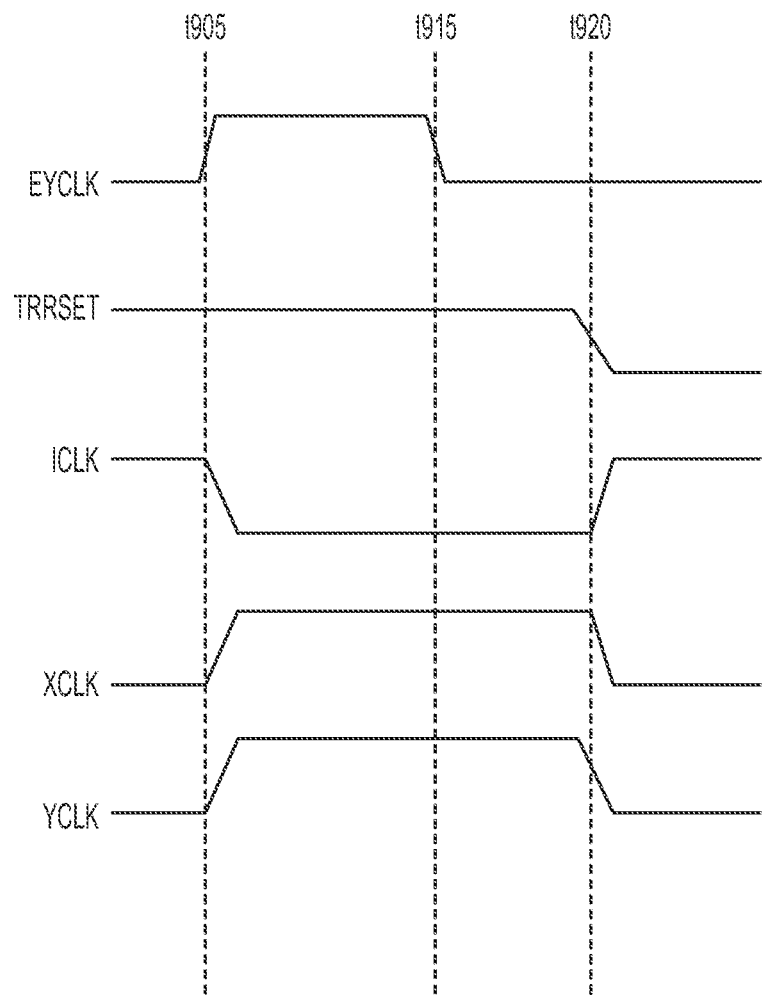

FIG. 9A is a table 900A illustrating the relationship of various signals, in accordance with some embodiments. In FIG. 9A (and FIG. 9B), tracking reset signal TRRSET falls after external clock EXCLK falls. In the below illustrations, a "1" refers to a logical high value, and a "0" refers to a logical low value. A symbol "A" refers to a rising transition while a symbol "v" refers to a falling transition.

For illustration, initially, signal TRRSET, clock ICLK, clock XLCK, and clock YCLK have a high, high, low, and low logic value, respectively. On line 905, clock EXCLK rises. Signal TRRSET remains logically high. The rising edge of clock EXCLK causes clock ICLK to fall, clock XCLK to rise, and clock YCLK to rise.

On line 910, external clock EXCLK and tracking reset signal TRRSET remain logically high. Clocks ICLK, XCLK, and YCLK also remain logically low, high, and high, respectively.

On line 915, external clock EXCLK falls, but does not affect signal TRRSET, clock ICLK, clock XCLK, or clock YCLK. That is, signal TRRSET, clock ICLK, clock XCLK, and clock YCLK remain logically high, low, high, and high, respectively.

On line 920, external clock EXCLK remains logically low. Tracking reset signal TRRSET, however, falls. The falling edge of tracking reset signal TRRSET causes clock ICLK to rise, clock XCLK to fall, and clock YCLK to fall.

FIG. 9B is a graph of waveforms illustrating the relationship of various signals, in accordance with some embodiments. Times t905, t915, and t920 correspond to line 905, 915, and 920 of FIG. 9A, respectively.

At time t905, the rising edge of clock EXCLK causes to clock ICLK to fall, clock XCLK to rise, and clock YCLK rise. As a result, clock EXCLK is logically high, signal TRRSET is logically high, clock ICLK is logically low, clock XCLK is logically high, and clock YCLK is logically high.

At time t915, clock EXCLK falls, but does not affect signal TRRSET, clock ICLK, clock XCLK, or clock YCLK. As a result, signal TRRSET, clock ICLK, clock XCLK, and clock YCLK remain logically high, low, high, and high, respectively.

At time t920, signal TRRSET falls and causes clock ICLK to rise, clock XCLK to fall, and YCLK to fall.

Figure 10B:
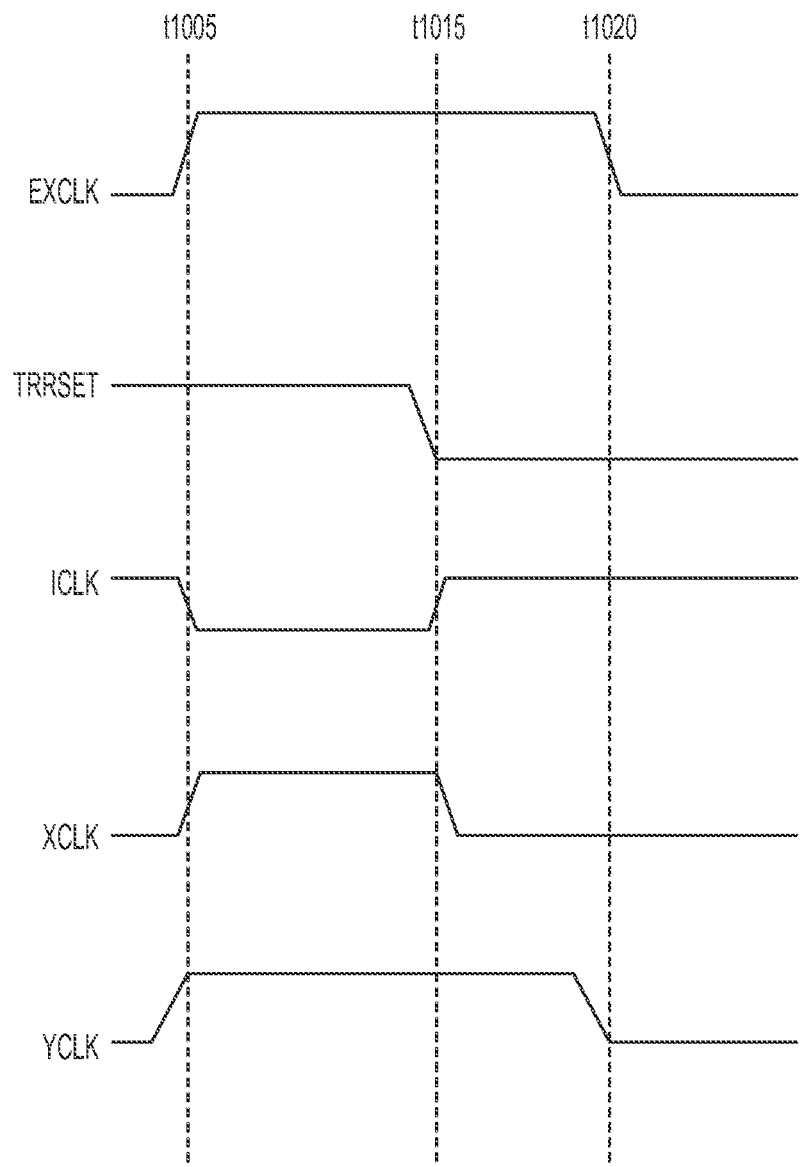

FIG. 10A is a table 1000A illustrating the relationship of various signals, in accordance with some embodiments. In FIG. 10A (and FIG. 10B below), tracking reset signal TRRSET falls before external clock EXCLK falls.

For illustration, initially, signal TRRSET, clock ICLK, clock XLCK, and clock YCLK have a high, high, low, and low logic value, respectively. On line 1005, clock EXCLK rises. Signal TRRSET remains logically high. The rising edge of clock EXCLK causes clock ICLK to fall, clock XCLK to rise, and clock YCLK to rise.

On line 1010, external clock EXCLK and tracking reset signal TRRSET remain logically high. Clocks ICLK, XCLK, and YCLK also remain logically low, high, and high, respectively.

On line 1015, external clock EXCLK remains logically high, but signal TRRSET falls. That is, signal TRRSET falls before clock EXCLK falls. The falling edge of signal TRRSET causes clock ICLK to rise, clock XCLK to fall, but does not affect clock YLCK. As a result, clock YCLK remains logically high.

On line 1020, signal TRRSET remains logically low. Clock EXCLK, however, falls. The falling edge of clock EXCLK causes clock YCLK to fall, but does not affect clocks ICLK and XCLK. As a result, clocks ICLK and XCLK remain logically high and low, respectively.

FIG. 10B is a graph of waveforms illustrating the relationship of various signals, in accordance with some embodiments. Times t1005, t1015, and t1020 correspond to line 1005, 1015, and 1020 of FIG. 10A, respectively.

At time t1005, the rising edge of clock EXCLK causes clock ICLK to fall, clock XCLK to rise, and clock YCLK rise. As a result, clock EXCLK is logically high, signal TRRSET is logically high, clock ICLK is logically low, clock XCLK is logically high, and clock YCLK is logically high.

At time t1015, signal TRRSET falls, which causes clock ICLK to rise, clock XLCK to fall, but does not affect clock YCLK. As a result, clock YCLK remains logically high.

At time t1020, clock EXCLK falls and causes clock YCLK to fall.

Based on the above illustration with reference to FIGS. 9A, 9B, 10A, and 10B, the high duration of clock YCLK is achieved by performing a logical OR operation of the duration of clock EXCLK and clock ICLKI, which is the inverse of clock ICLK. As a result, the high duration of clock YCLK is the longer of the high duration of clock EXCLK and the low duration of clock ICLK or the high duration of clock ICLKI.

Various embodiments are advantageous because the high duration of clock YCLK is longer and provides a better read margin. Based on a larger read margin, the read operation of memory macro 100 is performed at a lower operational voltage. In contrast with some other approaches, for example, when clock ICLKI is used to perform the functions of clock YCLK, the high duration of clock ICLKI could be shorter than the high duration of clock YCLK in various conditions, and therefore provides a smaller read margin.

Exemplary Method of Generating Clock YCLK

Figure 11:
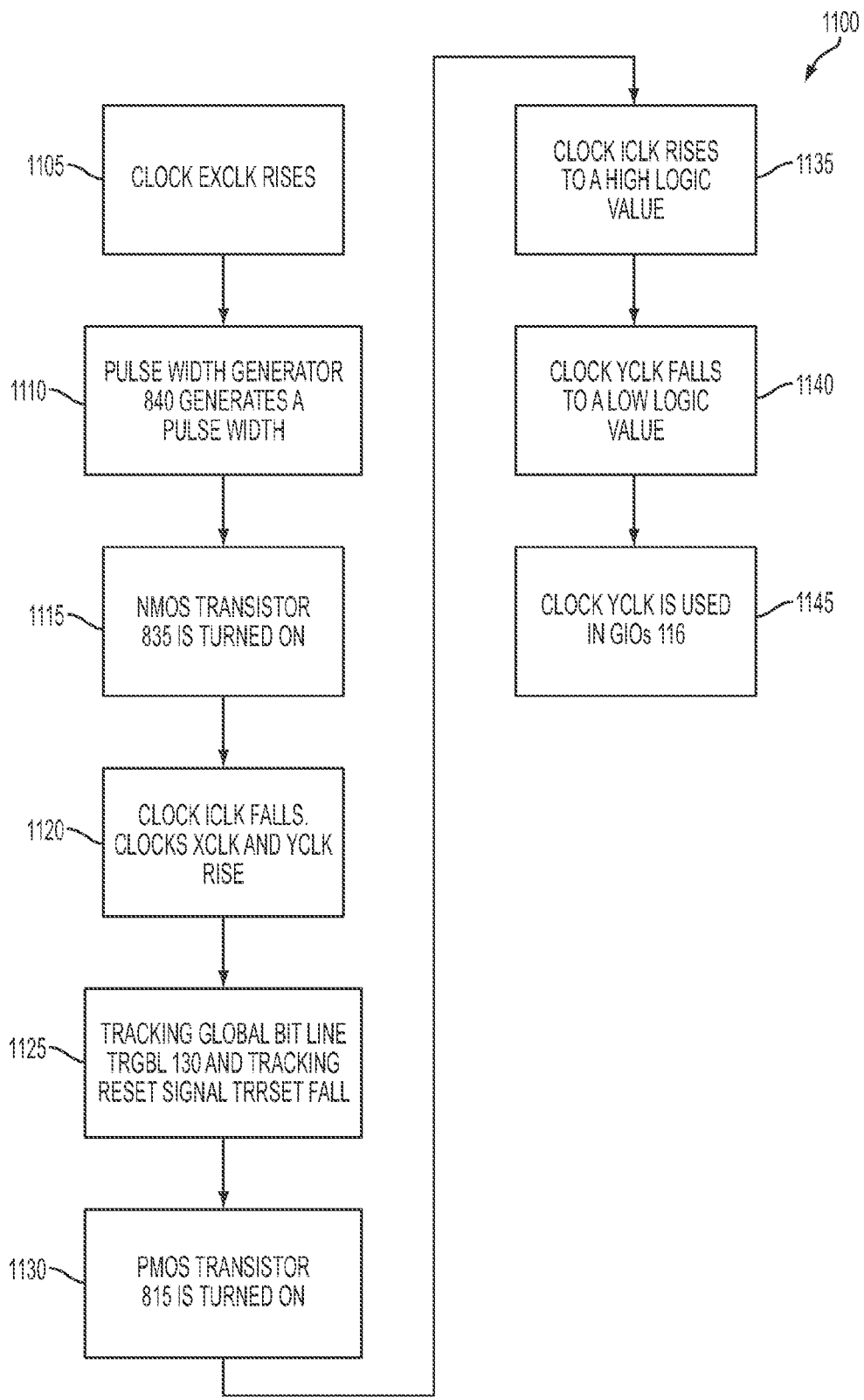
FIG. 11 is a flow chart illustrating an operation of the clock generation circuit, in accordance with some embodiments.

FIG. 11 is a flow chart of a method 1100 illustrating the creation of clock YCLK, in accordance with some embodiments. For illustration, initially, clock ICLK, tracking global bit line TRGBL, and tracking reset signal TRRSET are at a high logic value. In contrast, clock YCLK is at a low logic value.

In step 1105, clock EXCLK rises from a low logic value to a high logic value. The high logic value of clock EXCLK causes clock YCLK to rise.

In response, pulse width generator 840 generates a positive pulse PULSE in step 1110.

In step 1115, the high duration of the pulse PULSE causes NMOS transistor 835 to turn on.

As a result, in step 1120, clock ICLK falls to, which causes clock XCLK to rise.

In step, 1125, the high logic value of clock XCLK causes a tracking read word line RWL_TK of an upper tracking memory cell 124 and of a lower tracking memory cell 124 to be logically high. As a result, the upper tracking read bit line UP_TRRBL and the lower tracking read bit line LO_TRRBL corresponding to the upper tracking memory cell 124 and the lower tracking memory 124 are logically low. An LIO 106 coupled to the upper tracking read bit line UP_TRRBL and the lower tracking read bit line LO_TRRBL causes tracking global bit line TRGBL to be logically low. The falling edge of tracking global bit line TRGBL causes reset tracking signal TRRSET to fall.

As a result, in step 1130, PMOS transistor 815 is turned on. In various embodiments, delay circuit 820 is used to cause PMOS transistor 815 to turn on at a predetermined time. In addition, when PMOS transistor 815 is turned on, NMOS transistor 835 has been turned off to be electrically disconnected from clock ICLK. For example, the pulse PULSE generated in step 1110 is designed to fall before tracking reset signal TRRSET falls. Consequently, as soon as pulse PULSE falls, NMOS transistor 835 is turned off.

In step 1135, PMOS transistor 815 being on pulls clock ICLK to a high logic value at the source of transistor 815.

In step 1140, the rising edge of clock ICLK causes clock YCLK to fall.

In step 1145, clock YCLK is used in the reading and writing of the data that have been transferred to global GIOs 116 of memory macro 100.

Exemplary Tracking Cell in the Y Direction

Figure 12:
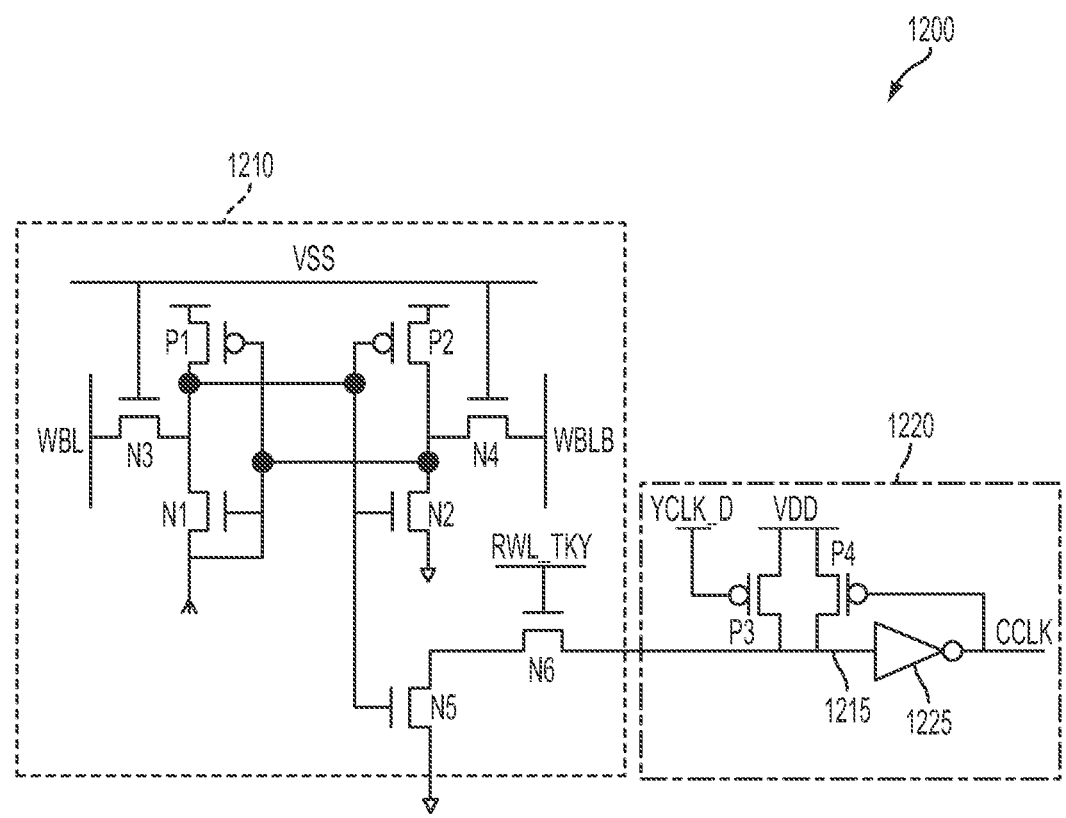
FIG. 12 is a diagram of a tracking cell in the Y direction, in accordance with some embodiments.

FIG. 12 is a diagram of a tracking cell 1200 in the Y-decoder direction, in accordance with some embodiments. Tracking cell 1200 includes circuits 1210 and 1220.

Circuit 1210 includes circuit components similar to those of a memory cell 122, but some components in circuit 1210 are configured differently. For example, in circuit 1210, the gates of transistors P1 and N1 are coupled to the sources of transistors N1 and N2 that receive reference voltage VSS. Write word line WWL is configured to receive reference voltage VSS, and the drain of transistor N6 is coupled to node 1215 of circuit 1220. Tracking read word line RWL_TKY corresponds to read word line RWL in FIG. 3.

Clock YCLK_D in circuit 1220 is a clock YCLK in FIG. 8, delayed by a time delay TDLY (not labeled). In some embodiments, the falling edge of clock YCLK causes tracking read word line RWL_TKY to rise, and the falling edge of clock YCLK_D causes tracking read word line RWL_TKY to fall. In other words, the pulse width of tracking read word line RWL_TKY is determined based on the falling edge of clock YCLK and the falling edge of clock YCLK_D. In some embodiments, time delay TDLY and/or the pulse width of tracking read word line RWL_TKY is calculated considering the times it takes for node 1215 to fall from a high logic value to a low logic value and the time for the data on node 1334 in FIG. 13 to maintain at the same logic state, considering the time for inverter 1338 to invert the data on node 1334 and the time for inverter 1336 to re-invert the data back to node 1334.

In some embodiments, when a high logic value of clock YCLK causes tracking read word line RWL_TKY to rise and turns on NMOS transistor N6 in circuit 1210, the logical high value of clock YCLK_D continues to turn off PMOS transistor P3. Consequently, transistor P3 and thus clock YCLK_D and clock YCLK have no electrical effect on node 1215.

Circuit 1210 together with circuit 1220 generates clock CCLK based on the activation of tracking read word line RWL_TKY. For example, in some embodiments, initially, clock YCLK is turned off or is at a low logical value. At a rising edge of clock EXCLK, clock generator 109 also causes clock YCLK to rise. When clock YCLK falls as illustrated in FIG. 9B or 10B, the falling edge of clock YCLK activates tracking read word line RWL_TKY. In some embodiments, an inverter inverts clock YCLK to form a high logic value for tracking read word line RWL_TKY. The rising edge of tracking word line RWL_TKY causes NMOS transistor N6 in circuit 1210 to turn on. As a result, node 1215 is pulled to ground at the source of transistor N5. Clock CCLK, through inverter 1225, therefore rises. In other words, the rising edge of clock CCLK is generated. The rising edge of clock CCLK causes PMOS transistor P4 to turn off. At that time, the high logic value of clock YCLK_D keeps PMOS transistor P3 turned off. Because transistors P3 and P4 are turned off, node 1215 and thus clock CCLK are not electrically affected by transistors P3 and P4.

After clock YCLK falls as illustratively shown in FIGS. 9B and 10B, clock YCLK_D falls a time delay TDLY later. Transistor P3 is turned on. Node 1215 is pulled to voltage VDD at the source of transistor P3. By operation of inverter 1225, clock CCLK falls. Effectively, the falling edge of clock CCLK is generated.

When node 1215 is logically high, even if transistor P3 is turned off, node 1215 continues to be logically high because when node 1215 is logically high, clock CCLK at the gate of PMOS transistor P4 is logically low through inverter 1225. As a result, transistor P4 is turned on, and node 1215 is pulled to voltage VDD at the source of transistor P4.

In some embodiments, tracking read word line RWL_TKY is generated as a positive pulse based on the falling edge of clock YCLK and of clock YCLK_D. As a result, tracking read word line RWL_TKY is logically high for the duration of the time when the pulse PULSE is logically high. Further, clock YCLK_D and tracking read word line RWL_TK are designed such that by the time clock YCLK_D is logically low to turn on PMOS transistor P3, NMOS transistor N6 has been turned off. Circuit 1210 is thus electrically disconnected from node 1215, and has no electrical effect on node 1215.

Exemplary Global IO Circuits

Figure 13:
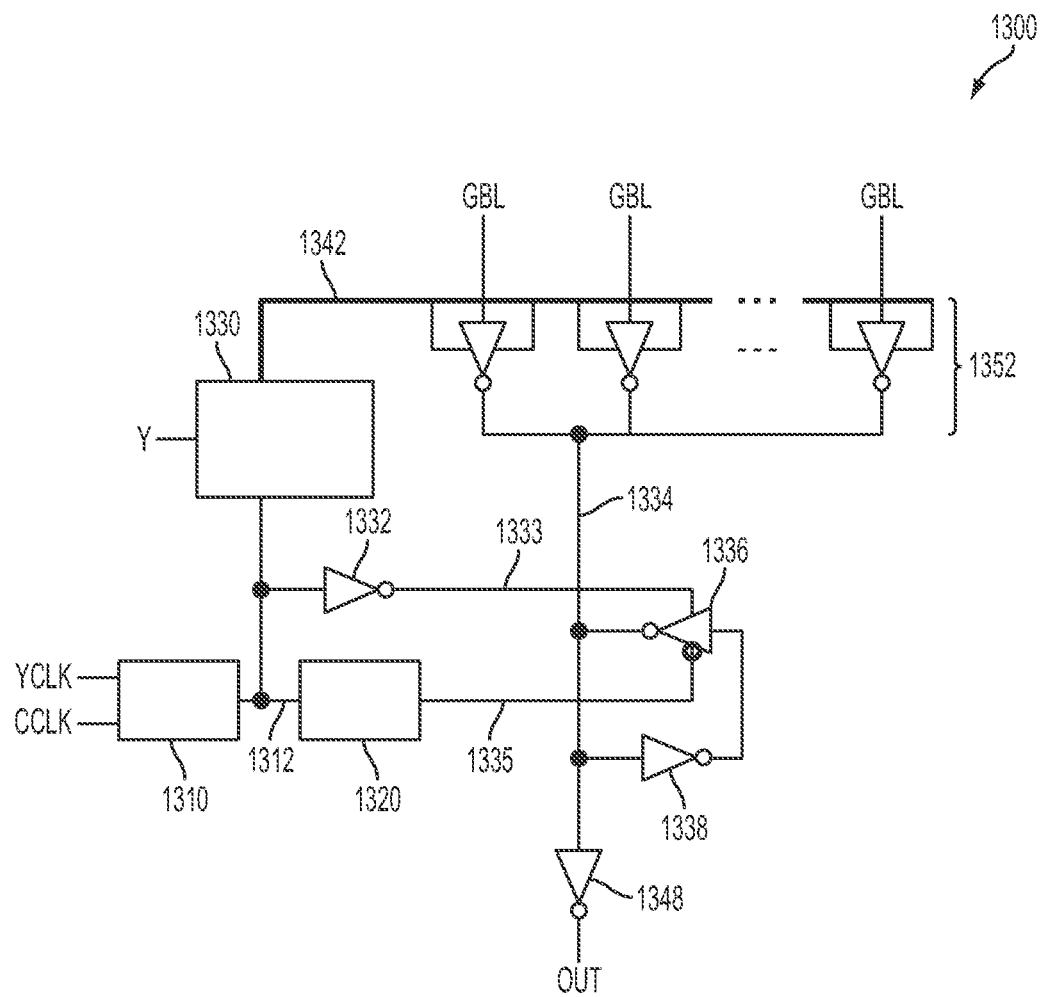
FIG. 13 is a diagram of a global input-output (IO) circuit, in accordance with some embodiments.

FIG. 13 is a diagram of a global 10 circuit 1300, in accordance with some embodiments. The signals on nodes 1312, 1333, 1334, 1335, and 1342 are called signals S1312, S1333, S1334, S1335, and S1342, respectively, and are not labeled.

Circuit 1300, based on clock YCLK, clock CCLK, and signal Y, turns on and off Y-mux tri state buffers 1352, simulating a read condition of a memory cell 122. Circuit 1300 includes a plurality of buffers 1352. Each buffer 1352 receives a global bit lines GBL. The number of buffers 1352 and thus the number of global bit lines GBL correspond to the number of columns in memory macro 100. For simplicity, signal Y is shown as one signal, but the number of signals Y corresponds to the number of buffers 1352. Signal Y is generated by GCTRL 110 based on the address of a memory cell 122 to be read. Based on a signal Y(i), circuit 1330 generates signal S1342 to turn on a corresponding buffer 1352(i). When buffer 1352(i) is turned on, the corresponding data in a memory cell 122 that is transferred to one of a global bit line GBL(i) is transferred to node 1334. The data on node 1334 is in turn transferred to output Out via inverter 1348 for use by other circuitries (not shown) outside of memory macro 100. When buffer 1352(i) is turned off, however, the data on global bit line GBL(i) is prevented from being transferred to node 1334. In some embodiments, when all buffers 1352 are turned off, inverter 1336 is turned to maintain the data on node 1334, and global bit lines GBL are charged to a high logic value.

In some embodiments, at a rising edge of clock EXCLK, clock generator 109 causes clock YCLK to rise. The rising edge of clock YCLK causes signal S1312 on node 1312 to rise. Circuit 1330, based on signal S1312 and signal Y, generates a signal S1342 on line 1342 to turn on a corresponding buffer 1352(i). Explained in a different way, the rising edge of clock YCLK opens a tri state buffer 1352(i). In addition, the rising edge of clock YCLK also turns off the charging circuit (not shown) used to charge global bit lines GBL.

Inverters 1336 and 1338 function as a latch to store and latch the data on node 1334. A latching circuit used in place of inverters 1336 and 1338 are within the scope of various embodiments. Signal S1333 on line 1333 and signal S1335 on line 1335 turn on or off inverter 1336. Signal S1335 is an inverse logic of signal S1333. For example, when signal S1312 is logically high, signal S1333 is logically low and signal S1335 is logically high. As a result, tri-state feed back inverter 1336 is turned off, and node 1334 is not affected by inverters 1338 and 1336. In some embodiments, at that time, a buffer 1352(i) is turned on to allow the data on a global bit line GBL(i) to be transferred to node 1334. But when signal S1312 is logically low, signal S1333 is logically high and signal S1335 is logically low. Inverter 1336 is therefore turned on. Consequently, the data on node 1334 maintains the same value because inverter 1338 inverts the signal on node 1334, which is then re-inverted by inverter 1336 back to node 1334. In some embodiments, when all buffers 1352 are turned off, the data on global bit lines GBL is prevented from being transferred to node 1334.

In some embodiments, when clock YCLK falls, clock CCLK rises. Circuit 1310, based on the rising edge of clock CCLK, causes signal S1312 to fall. Circuit 1330, based on the address provided by signal Y and the falling edge of signal S1312, causes the corresponding buffer 1352(i) to turn off. Effectively, the falling edge of clock YCLK or the rising edge of clock CCLK turns off the corresponding buffer 1352(i). The data on the corresponding global bit line GBL(i) is prohibited from being transferred to node 1334. In some embodiments, circuit 1310 includes the logic to implement table 14 in FIG. 14.

Circuit 1320, in some embodiments, include two inverters (not shown) coupled in series to generate signal S1335 on line 1335 that is an inverse logic of signal S1333 on line 1333. Signals S1333 and S1335 are used to turn on and off inverter 1336.

Figure 14:
FIG. 14 is a table implementing a sub-circuit of the global IO circuit, in accordance with some embodiments.

FIG. 14 is a table 1400 illustrating the function of circuit 1310, in accordance with some embodiments. On line 1410, when clock YCLK falls, clock CCLK rises. Signal S1312 is pulled to a low logic value and stays at the low logic value. On line 1420, when clock YCLK rises, clock CCLK falls. Signal S1312 is pulled to a high logic value and stays at the high logic value. Circuitries used to implement circuit 1310 based on table 1400 are within the scope of various embodiments.

Figure 15:
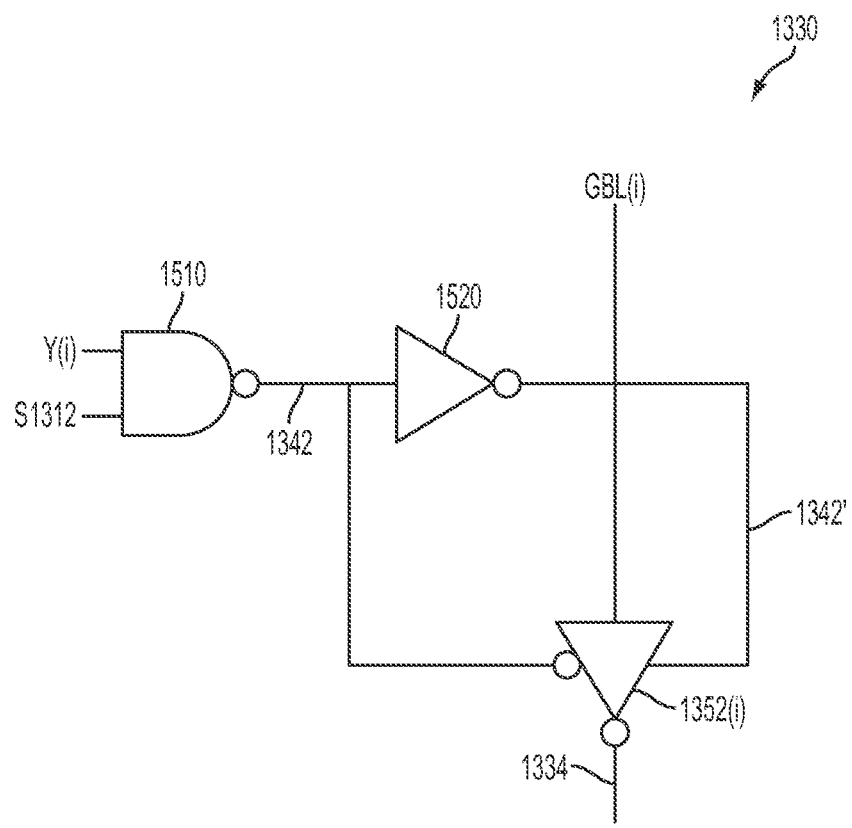
FIG. 15 is a detailed diagram of another sub-circuit of the global IO circuit, in accordance with some embodiments.

FIG. 15 is a diagram of circuit 1330, in accordance with some embodiments. NAND gate 1510 receives signal S1312 on line 1312 and a signal Y(i) as inputs. Signal Y(i) corresponds to a buffer 1352(i). Buffer 1352(i) receives global bit line GBL(i) that corresponds to buffer 1352(i), and inverts the data on global bit line GBL(i) to result in signal S1334 on node 1334. Signals 1342 and 1342' are used to turn on and off buffer 1352(i). Signal 1342' is the inverse logic of signal 1342 via inverter 1520.

Exemplary Tracking Circuit in the Y Direction

FIG. 16 is a diagram of a Y-tracking circuit 1600 illustrating tracking in the Y-decoder direction, in accordance with some embodiments.

FIG. 16 shows clock generator 109 and two tracking circuits 158 in FIG. 1 that receive two tracking read word lines RWL_TKY. One circuit 158 and thus one tracking read word lines RWL_TKY are each on the left and on the right side of clock generator 109. Effectively, one read tracking word line RWL_TKY is on the left side, and one tracking read word line RWL_TKY is on the right side of memory macro 100. Each of a tracking read word line RWL_TKY is coupled to the gates of transistors N6 of circuits 1210 of tracking cells 1200. In some embodiments, the high logic value of a tracking read word line RWL_TKY is generated by inverting a low logic value of clock YCLK.

FIG. 16 also shows two clock lines of clock YCLK generated by clock generator 109. A clock line YCLK couples a plurality of tracking cells 1200. Each circuit 1300 in FIG. 13 is coupled to a corresponding tracking cell 1200 via the signal line of clock CCLK. For simplicity, one signal line of clock CCLK is labeled.

Exemplary Waveforms for Tracking in the Y Direction

Figure 17:
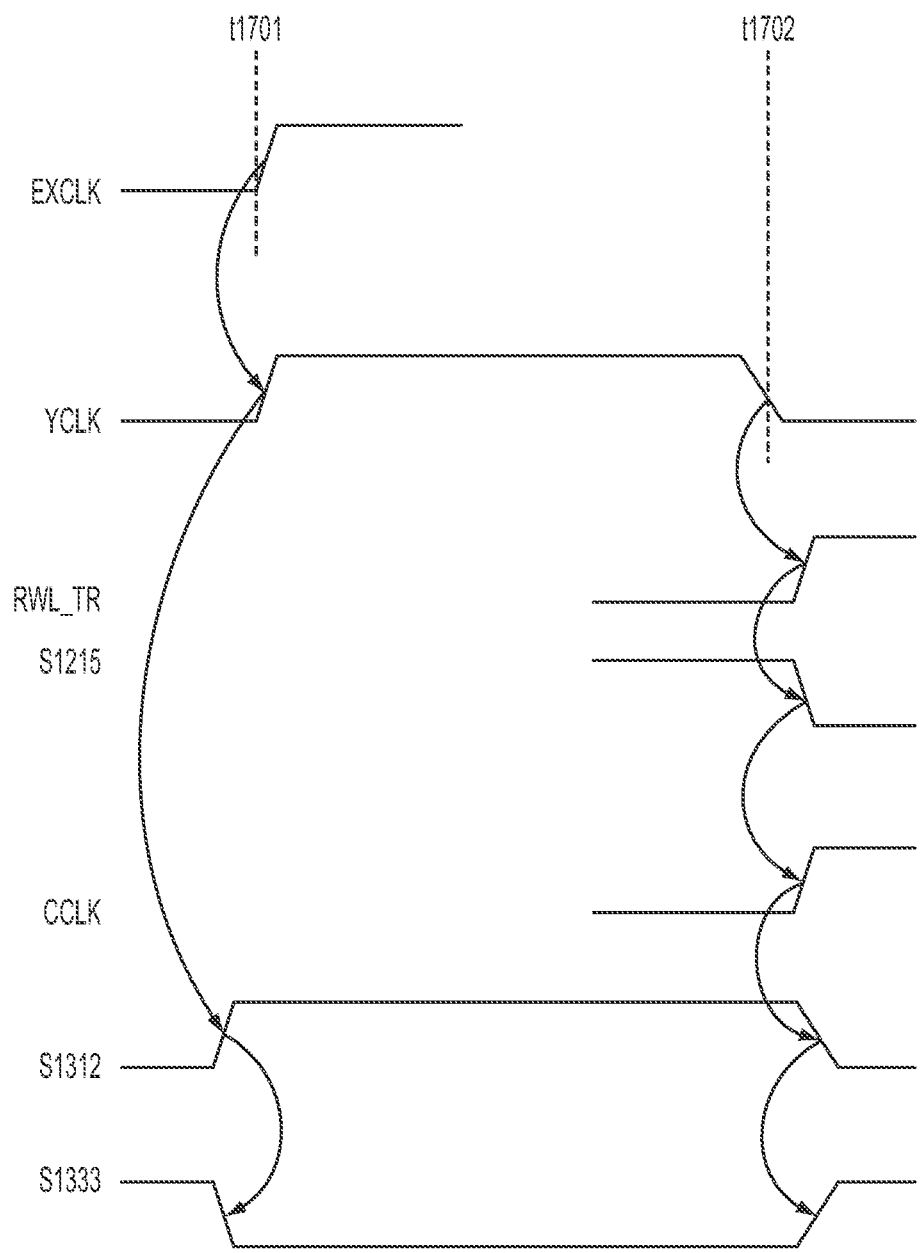
FIG. 17 is a graph of waveforms illustrating the relationships of various signals, in accordance with some embodiments.

FIG. 17 is a graph of waveforms illustrating relationships of various signals, in accordance with some embodiments.

At time t1701, a rising edge of clock EXCLK causes clock YCLK to rise. As a result, circuit 1310 causes signal S1312 to rise. Circuit 1310 causes a buffer 1352(i) to turn on. Inverter 1332 causes signal S1333 to fall and signal S1335 to rise. The waveform of signal S1335 is not shown. Inverter 1336 is therefore turns off. Effectively, the corresponding data on global bit line GBL(i) is transferred to node 1334 via the turned-on buffer 1352(i).

At time t1710, YCLK falls and causes tracking read word line RWL_TKY to rise. Transistors N5 and N6 in circuit 1210 are turned on and causes signal S1215 at node 1215 of circuit 1220 to fall, clock CCLK to rise, signal S1312 to fall, and signal S1333 to rise. As a result, inverter 1336 is turned on, and the corresponding buffer 1352(i) is turned off, preventing data from global bit line GBL(i) to be transferred to node 1334. Because inverter 1336 is on, the data on node 1334 is maintained through inverters 1338 and 1336.

Exemplary Tracking Method in the Y Direction

Figure 18:
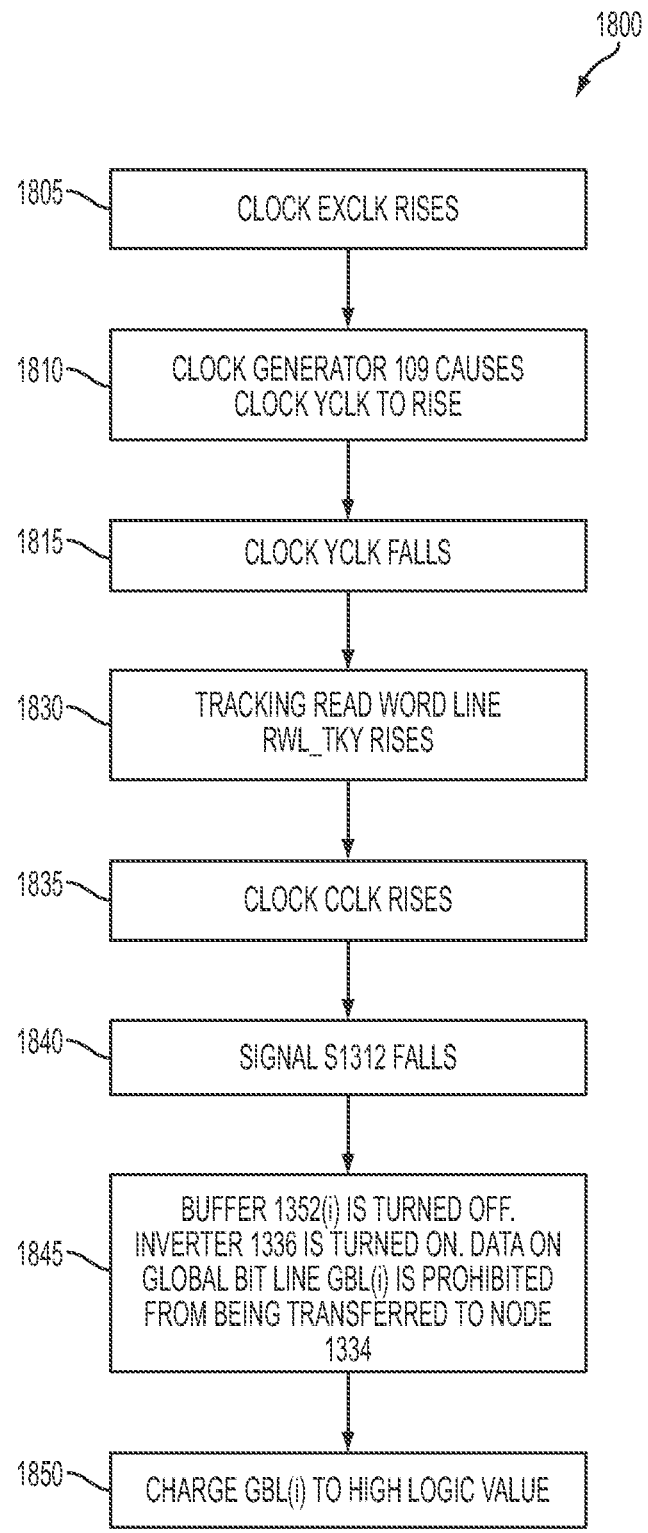
FIG. 18 is a flowchart of a method illustrating tracking in the Y direction, in accordance with some embodiments.

FIG. 18 is a flowchart of a method 1800 illustrating a tracking operation in the Y-decoder direction, in accordance with some embodiments.

In operation 1805, clock EXCLK rises.

In operation 1810, clock generator 109 causes clock YCLK to rise based on the rising edge of clock EXCLK.

In operation 1815, clock YCLK falls, for example, as illustrated by FIGS. 9B and 10B.

In operation 1830, the falling edge of clock YCLK causes read tracking word line RWL_TKY to rise and transistors N6 in circuits 1210 of tracking cells 1200 of tracking circuit 158 in FIG. 16 to turn on.

In operation 1835, each pair of transistors N5 and N6 in circuit 1210 pulls node 1215 in circuit 1220 of tracking cells 1200 of circuit 158 to ground at the source of transistor N5. Clock CCLK, as a result, rises.

In operation 1840, circuit 1310, based on the rising edge of clock CCLK, causes signal S1312 in circuit 1300 to fall.

In operation 1845, circuit 1330, based on the falling edge of signal S1312 and address Y(i), causes buffer 1352(i) to turn off. In some embodiments, address Y(i) is provided based on the corresponding address of the memory cell to be read.

At the same time signal S1312 through inverter 1332 causes signal S1333 to rise, and through circuit 1320, causes signal S1335 to fall. As a result, inverter 1336 is turned on. As a result, data from the corresponding global bit line GBL(i) is prohibited from being transferred to node 1334, and inverters 1336 and 1338 maintain the data on line 1334.

In operation 1850, global bit line GBL(i) is charged to a high logic value.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level (e.g., Low or High) of the various signals used in the above description is also for illustration purposes. Various embodiments are not limited to a particular level when a signal is activated and/or deactivated. Selecting different levels is within the scope of various embodiments.

In accordance with some embodiments, a memory macro includes a plurality of segments corresponding to a plurality of tracking circuits. Each segment of the plurality of segments thereby corresponds to one tracking circuit of the plurality of tracking circuits. In response to a read operation of a memory cell of a segment, a tracking circuit corresponding to the segment is configured to generate an edge of a tracking signal based on which a first edge of a cell signal associated with the memory cell is generated.

In accordance with some embodiments, a method includes generating a first edge of a cell signal to be used in reading a memory cell in a memory macro having a plurality of segments. Each segment of the plurality of segments includes a tracking circuit. The corresponding tracking circuit of a segment that includes the memory cell is caused to generate a first tracking signal. A second edge of the cell signal is generated based on the first tracking signal.

In accordance with some embodiments, a memory macro includes a global tracking bit line, a plurality of tracking circuits, a plurality of segments of memory cells, and a set of control circuits. Each one of the plurality of tracking circuits includes a tracking signal output node and a sub-circuit configured to discharge the global tracking bit line responsive to a signal at the tracking signal output node. Each segment of the plurality of segments corresponds to one tracking circuit of the plurality of tracking circuits. The set of control circuits is configured to activate a tracking circuit of the plurality of tracking circuits corresponding to a selected segment of the plurality of segments of memory cells in response to a read operation. The read operation is performed to read a memory cell of the selected segment.

The above methods show exemplary steps, but the steps are not necessarily performed in the order shown. Steps may be added, replaced, changed order, and/or eliminated as appropriate, in accordance with the spirit and scope of disclosed embodiments.

What is claimed is:

1. A memory macro comprising:
a plurality of segments corresponding to a plurality of tracking circuits, each segment of the plurality of segments thereby corresponding to one tracking circuit of the plurality of tracking circuits,
wherein
in response to a read operation of a memory cell of a segment, a tracking circuit corresponding to the segment is configured to generate an edge of a tracking signal based on which a first edge of a cell signal associated with the memory cell is generated.

2. The memory macro of claim 1, further comprising a clock generator circuit and a first circuit, wherein
the clock generator circuit is configured to receive a first edge of a first clock signal, to generate a first edge of a second clock signal based on the first edge of the first clock signal, and to generate a second edge of the second clock signal based on the edge of the tracking signal;
the first circuit is configured to generate the first edge of the cell signal based on the first edge of the second clock signal;
the tracking circuit is configured to generate the edge of the tracking signal based on the first edge of the second clock signal; and
the first circuit is configured to generate a second edge of the cell signal based on the second edge of the second clock signal.

3. The memory macro of claim 1, wherein a read word line terminal of the memory cell is configured to receive the cell signal.

4. The memory macro of claim 1, further comprising a first data line configured to couple the plurality of tracking circuits via a plurality of first circuits.

5. The memory macro of claim 4, further comprising a second data line configured to couple a plurality of second circuits, a first number of the first circuits equal to a second number of the second circuits.

6. The memory macro of claim 1, further comprising:
a first data line electrically coupled with the plurality of tracking circuits of the plurality of segments; and
a second data line electrically coupled with a plurality of local input-output circuits of the plurality of segments, wherein the first data line and the second data line are arranged to have comparable dimensions.

7. The memory macro of claim 1, wherein one of the plurality of tracking circuits comprises:
at least one driving column comprising a first local bit line and a local input-output circuit configured to electrically coupling the first local bit line with a global tracking bit line of the memory macro; and
at least one loading column comprising a second local bit line, the second local bit line being electrically coupled with the first local bit line.

8. The memory macro of claim 7, wherein the at least one driving column comprises:
at least one tracking cell electrically coupled with the first local bit line; and
at least one dummy cell electrically coupled with the first local bit line.

9. A method comprising:
generating a first edge of a cell signal to be used in reading a memory cell in a memory macro having a plurality of segments, each segment of the plurality of segments comprising a tracking circuit;
causing the corresponding tracking circuit of a segment that includes the memory cell to generate a first tracking signal; and
generating a second edge of the cell signal based on the first tracking signal.

10. The method of claim 9, further comprising:
generating, based on a first edge of a first clock signal, a first edge of a second clock signal;
generating a first edge of a second tracking signal of the tracking circuit based on the first edge of the second clock signal;
generating a first edge of a third tracking signal of the tracking circuit based on the first edge of the second clock signal; and
generating a second edge of the second clock signal based on the first tracking signal,
wherein the generating the first tracking signal is performed based on the first edge of the third tracking signal.

11. The method of claim 9, wherein the tracking circuits of the plurality of segments are coupled with a tracking data line having the first tracking signal thereon.

12. The method of claim 9, wherein
the causing the corresponding tracking circuit of the segment that includes the memory cell to generate the first tracking signal comprises:
causing the first tracking signal to have a first logical value; and
generating a first edge of the first tracking signal transitioning from the first logical value to a second logical value in response to the first edge of the cell signal; and
the generating the second edge of the cell signal is performed in response to the first edge of the first tracking signal.

13. A memory macro comprising:
a global tracking bit line;
a plurality of tracking circuits, each one of the plurality of tracking circuits comprising:
a tracking signal output node; and
a sub-circuit configured to discharge the global tracking bit line responsive to a signal at the tracking signal output node;
a plurality of segments of memory cells, each segment of the plurality of segments corresponding to one tracking circuit of the plurality of tracking circuits; and
a set of control circuits configured to activate a tracking circuit of the plurality of tracking circuits corresponding to a selected segment of the plurality of segments of memory cells in response to a read operation, the read operation being performed to read a memory cell of the selected segment.

14. The memory macro of claim 13, further comprising:
a global data bit line; and
a plurality of local input-output (LIO) circuits electrically coupled with the global data bit line, each segment of the plurality of segments corresponding to one LIO circuit of the plurality of LIO circuits,
wherein the global tracking bit line and the global data bit line are arranged to have comparable dimensions.

15. The memory macro of claim 13, further comprising:
a global data bit line; and
a plurality of local input-output (LIO) circuits electrically coupled with the global data bit line, each segment of the plurality of segments corresponding to one LIO circuit of the plurality of LIO circuits,
a number of LIO circuits of the plurality of local input-output (LIO) circuits being equal to a number of tracking circuits of the plurality of tracking circuits.

16. The memory macro of claim 13, wherein one of the plurality of tracking circuits further comprises:
at least one driving column comprising a first local bit line and a tracking LIO circuit configured to electrically coupling the first local bit line with the global tracking bit line, the tracking LIO circuit comprising the tracking signal output node and the sub-circuit of the one of the plurality of tracking circuits; and at least one loading column comprising a second local bit line, the second local bit line being electrically coupled with the first local bit line.

17. The memory macro of claim 16, wherein the at least one driving column comprises:
   at least one tracking cell electrically coupled with the first local bit line; and
   at least one dummy cell electrically coupled with the first local bit line.

18. The memory macro of claim 13, further comprising:
   a clock generator circuit configured to generate a first edge of a second clock signal based on a first edge of a first clock signal, and to generate a second edge of the second clock signal based on an edge of a tracking signal on the global tracking bit line,
   wherein
      the set of control circuits is configured to generate a first edge of a cell signal based on the first edge of the second clock signal; and
      the tracking circuit of the plurality of tracking circuits corresponding to the selected segment is configured to generate the edge of the tracking signal based on the first edge of the second clock signal.

19. The memory macro of claim 18, wherein the set of control circuits is configured to generate a second edge of the cell signal based on the second edge of the second clock signal.

20. The memory macro of claim 18, further comprising a read word line extending through the selected segment and configured to carry the tracking signal.

* * * * *